(12) United States Patent  
Mandlik et al.

(10) Patent No.: US 8,933,468 B2  
(45) Date of Patent: Jan. 13, 2015

(54) ELECTRONIC DEVICE WITH REDUCED NON-DEVICE EDGE AREA

(75) Inventors: Prashant Mandlik, Lawrenceville, NJ (US); Ruiqing Ma, Morristown, NJ (US); Jeff Silvernail, Yardley, PA (US); Julia J. Brown, Yardley, PA (US); Lin Han, Princeton, NJ (US); Sigurd Wagner, Princeton, NJ (US); Luke Walski, Princeton, NJ (US)

(73) Assignees: Princeton University Office of Technology and Trademark Licensing, Princeton, NJ (US); Universal Display Corporation, Ewing, NJ (US)

( * ) Notice: Subject to any disclaimer, the term of this patent is extended or adjusted under 35 U.S.C. 154(b) by 0 days.

(21) Appl. No.: 13/422,924

(22) Filed: Mar. 16, 2012

(65) Prior Publication Data

US 2013/0241076 A1 Sep. 19, 2013

(51) Int. Cl.
*H01L 29/18* (2006.01)
*H01L 33/00* (2010.01)
(Continued)

(52) U.S. Cl.
CPC ........ *H01L 25/0753* (2013.01); *H01L 27/3209* (2013.01)
USPC .............................. 257/88; 438/22

(58) Field of Classification Search
CPC . H01L 21/02362; H01L 21/108; H01L 28/56; H01L 31/143; H01L 27/15; H01L 2224/48465; H01L 2224/97; H01L 2224/32225; H01L 33/486; H01L 2924/12041; H01L 25/0753; H01L 24/97; H01L 27/153; H01L 31/0203; H01L 33/08; H01L 2224/8592; H01L 2933/0033; H01L 51/0533; H01L 21/02164; H01L 2251/05

USPC .......... 257/40, 13, 66, 72, 79–103, 223, 227, 257/291, 292, 439, 443, 655, 642–643, 257/759; 438/29, 69, 82, 486
See application file for complete search history.

(56) References Cited

U.S. PATENT DOCUMENTS

| 4,769,292 A | 9/1988 | Tang et al. |
| 5,247,190 A | 9/1993 | Friend et al. |
| 5,703,436 A | 12/1997 | Forrest et al. |

(Continued)

FOREIGN PATENT DOCUMENTS

| WO | WO 2005/051525 | 6/2005 |
| WO | WO 2010/011390 | 1/2010 |

OTHER PUBLICATIONS

Baldo et al., "Highly Efficient Phosphorescent Emission from Organic Electroluminescent Devices," Nature, vol. 395, 151-154, (1998).

(Continued)

*Primary Examiner* — Jae Lee
*Assistant Examiner* — Junaiden Mirsalahuddin
(74) *Attorney, Agent, or Firm* — Morris & Kamlay LLP

(57) ABSTRACT

A first product may be provided that comprises a substrate having a first surface, a first side, and a first edge where the first surface meets the first side; and a device disposed over the substrate, the device having a second side, where at least a first portion of the second side is disposed within 3 mm from the first edge of the substrate. The first product may further comprise a first barrier film that covers at least a portion of the first edge of the substrate, at least a portion of the first side of the substrate, and at least the first portion of the second side of the device.

17 Claims, 19 Drawing Sheets

(51) Int. Cl.
*H01L 27/32* (2006.01)
*H01L 25/075* (2006.01)

(56) References Cited

U.S. PATENT DOCUMENTS

| | | | |
|---|---|---|---|
| 5,707,745 | A | 1/1998 | Forrest et al. |
| 5,834,893 | A | 11/1998 | Bulovic et al. |
| 5,844,363 | A | 12/1998 | Gu et al. |
| 6,013,982 | A | 1/2000 | Thompson et al. |
| 6,087,196 | A | 7/2000 | Sturm et al. |
| 6,091,195 | A | 7/2000 | Forrest et al. |
| 6,097,147 | A | 8/2000 | Baldo et al. |
| 6,294,398 | B1 | 9/2001 | Kim et al. |
| 6,303,238 | B1 | 10/2001 | Thompson et al. |
| 6,337,102 | B1 | 1/2002 | Forrest et al. |
| 6,468,819 | B1 | 10/2002 | Kim et al. |
| 6,548,912 | B1 | 4/2003 | Graff et al. |
| 7,279,704 | B2 | 10/2007 | Walters et al. |
| 7,431,968 | B1 | 10/2008 | Shtein et al. |
| 7,968,146 | B2 | 6/2011 | Wagner et al. |
| 2003/0143856 | A1* | 7/2003 | Givens et al. ............. 438/710 |
| 2003/0230980 | A1 | 12/2003 | Forrest et al. |
| 2004/0046497 | A1 | 3/2004 | Schaepkens et al. |
| 2004/0174116 | A1 | 9/2004 | Lu et al. |
| 2004/0195960 | A1 | 10/2004 | Czeremuszkin et al. |
| 2007/0042610 | A1* | 2/2007 | Xia et al. ................. 438/778 |
| 2008/0053522 | A1* | 3/2008 | Basol ....................... 136/256 |
| 2008/0102206 | A1 | 5/2008 | Wagner |
| 2008/0102223 | A1 | 5/2008 | Wagner et al. |
| 2008/0238301 | A1* | 10/2008 | Shim et al. ............... 313/504 |
| 2011/0114994 | A1 | 5/2011 | Mandlik et al. |
| 2012/0326170 | A1* | 12/2012 | Liu et al. ................... 257/82 |

OTHER PUBLICATIONS

Baldo et al., "Very high-efficiency green organic light-emitting devices based on electrophosphorescence," Appl. Phys. Lett., vol. 75, No. 3, 4-6 (1999).

G. L. Graff, et al., "Mechanisms of vapor permeation through multilayer barrier films: Lag time versus equilibrium permeation," J. Appl. Phys., 96 (4), pp. 1840-1849 (2004).

Z. Chen, et al., "Molecular Dynamics Simulation of Water Diffusion Inside an Amorphous Polyacrylate Latex Film," Journal of Polymer Science: Part B: Polymer Physics, vol. 45, 884-891 (2007).

L.S. Pan et al.,, Electronic Properties and Applications, Springer, pp. 104-107, 1995.

P. Mandlik, et al., Applied Physics Letters, 92, (10), pp. 103309-1-103309-3 (2008).

U.S. Appl. No. 61/086,047, filed Apr. 8, 2008.
U.S. Appl. No. 11/783,361, filed Apr. 9, 2007.
U.S. Appl. No. 13/365,921, filed Feb. 3, 2012.
U.S. Appl. No. 12/990,860, filed May 5, 2009.
U.S. Appl. No. 13/422,926, filed Mar. 16, 2012.

J. C. Fisher, "Calculation of Diffusion Penetration Curves for Surface and Grain Boundary Diffusion" Journal of Applied Physics, 22 (1), pp. 74-77 (1951).

Eric Charles Suloff, Phd Thesis, "Sorption Behavior of an Aliphatic Series of Aldehydes in the Presence of Poly (ethylene terephthalate) Blends Containing Aldehyde Scavenging Agents," Virginia Polytechnic Institute and State University, Nov. 21, 2002.

K. Ghosal et al., "Gas separation using polymer membranes: An overview," Polym. Adv. Technol., 5, 673-697 (1994).

Hajimu Wakabayashi et al., "Diffusion of water into silica glass at low temperature" *J. Am. Cerum.* Soc., 72 [lo] 1850-55 (1989).

W.R. Vieth et al., "Transport properties and their correlation with the morphology of thermally conditioned polypropylene," Appl. Polym. Sci., 13, 685-712 (1969).

Goff, J. A.et al., "Low-pressure properties of water from −160 to 212°F.," in Transactions of the American Society of Heating and Ventilating Engineers, 52nd annual meeting of the American Society of Heating and Ventilating Engineers, New York, 1946, pp. 95-122.

Buck, A. L., "New equations for computing vapor pressure and enhancement factor", *J. Appl. Meteorol.* 20: 1527-1532, May 11, 1981.

* cited by examiner

ELECTRONIC DEVICE WITH REDUCED NON-DEVICE EDGE AREA

The claimed invention was made by, on behalf of, and/or in connection with one or more of the following parties to a joint university corporation research agreement: Princeton University, The University of Southern California, The University of Michigan and Universal Display Corporation. The agreement was in effect on and before the date the claimed invention was made, and the claimed invention was made as a result of activities undertaken within the scope of the agreement.

BACKGROUND OF THE INVENTION

Opto-electronic devices that make use of organic materials are becoming increasingly desirable for a number of reasons. Many of the materials used to make such devices are relatively inexpensive, so organic opto-electronic devices have the potential for cost advantages over inorganic devices. In addition, the inherent properties of organic materials, such as their flexibility, may make them well suited for particular applications such as fabrication on a flexible substrate. Examples of organic opto-electronic devices include organic light emitting devices (OLEDs), organic phototransistors, organic photovoltaic cells, and organic photodetectors. For OLEDs, the organic materials may have performance advantages over conventional materials. For example, the wavelength at which an organic emissive layer emits light may generally be readily tuned with appropriate dopants.

OLEDs make use of thin organic films that emit light when voltage is applied across the device. OLEDs are becoming an increasingly interesting technology for use in applications such as flat panel displays, illumination, and backlighting. Several OLED materials and configurations are described in U.S. Pat. Nos. 5,844,363, 6,303,238, and 5,707,745, which are incorporated herein by reference in their entirety.

One application for phosphorescent emissive molecules is a full color display. Industry standards for such a display call for pixels adapted to emit particular colors, referred to as "saturated" colors. In particular, these standards call for saturated red, green, and blue pixels. Color may be measured using CIE coordinates, which are well known to the art.

One example of a green emissive molecule is tris (2-phenylpyridine) iridium, denoted Ir(ppy)3, which has the structure of Formula I:

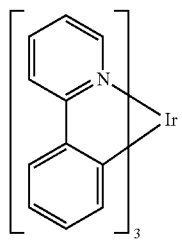

In this, and later figures herein, we depict the dative bond from nitrogen to metal (here, Ir) as a straight line.

As used herein, the term "organic" includes polymeric materials as well as small molecule organic materials that may be used to fabricate organic opto-electronic devices. "Small molecule" refers to any organic material that is not a polymer, and "small molecules" may actually be quite large. Small molecules may include repeat units in some circumstances. For example, using a long chain alkyl group as a substituent does not remove a molecule from the "small molecule" class. Small molecules may also be incorporated into polymers, for example as a pendent group on a polymer backbone or as a part of the backbone. Small molecules may also serve as the core moiety of a dendrimer, which consists of a series of chemical shells built on the core moiety. The core moiety of a dendrimer may be a fluorescent or phosphorescent small molecule emitter. A dendrimer may be a "small molecule," and it is believed that all dendrimers currently used in the field of OLEDs are small molecules.

As used herein, "top" means furthest away from the substrate, while "bottom" means closest to the substrate. Where a first layer is described as "disposed over" a second layer, the first layer is disposed further away from substrate. There may be other layers between the first and second layer, unless it is specified that the first layer is "in contact with" the second layer. For example, a cathode may be described as "disposed over" an anode, even though there are various organic layers in between.

As used herein, "solution processible" means capable of being dissolved, dispersed, or transported in and/or deposited from a liquid medium, either in solution or suspension form.

A ligand may be referred to as "photoactive" when it is believed that the ligand directly contributes to the photoactive properties of an emissive material. A ligand may be referred to as "ancillary" when it is believed that the ligand does not contribute to the photoactive properties of an emissive material, although an ancillary ligand may alter the properties of a photoactive ligand.

As used herein, and as would be generally understood by one skilled in the art, a first "Highest Occupied Molecular Orbital" (HOMO) or "Lowest Unoccupied Molecular Orbital" (LUMO) energy level is "greater than" or "higher than" a second HOMO or LUMO energy level if the first energy level is closer to the vacuum energy level. Since ionization potentials (IP) are measured as a negative energy relative to a vacuum level, a higher HOMO energy level corresponds to an IP having a smaller absolute value (an IP that is less negative). Similarly, a higher LUMO energy level corresponds to an electron affinity (EA) having a smaller absolute value (an EA that is less negative). On a conventional energy level diagram, with the vacuum level at the top, the LUMO energy level of a material is higher than the HOMO energy level of the same material. A "higher" HOMO or LUMO energy level appears closer to the top of such a diagram than a "lower" HOMO or LUMO energy level.

As used herein, and as would be generally understood by one skilled in the art, a first work function is "greater than" or "higher than" a second work function if the first work function has a higher absolute value. Because work functions are generally measured as negative numbers relative to vacuum level, this means that a "higher" work function is more negative. On a conventional energy level diagram, with the vacuum level at the top, a "higher" work function is illustrated as further away from the vacuum level in the downward direction. Thus, the definitions of HOMO and LUMO energy levels follow a different convention than work functions.

More details on OLEDs, and the definitions described above, can be found in U.S. Pat. No. 7,279,704, which is incorporated herein by reference in its entirety.

BRIEF SUMMARY OF THE INVENTION

Some embodiments provided herein may comprise a device, methods for manufacturing a device, and/or devices prepared by a process that reduce or eliminate non-device (or "dead space") of a device without suffering from an increase in degradation from atmospheric conditions. That is, for example, embodiments provided herein may comprise a device in which a portion of the device may be disposed at or near the edge of the substrate, without suffering an increase in device degradation by utilizing a barrier film as an edge seal that is disposed over at least a portion of the vertical side and/or edge of the substrate (as well as a side of the device). By so doing, the ingress across the interface of the barrier film and the substrate (which is typically faster than across the bulk of the barrier film) may maintain sufficient length without extending the barrier film layer in a direction perpendicular to a side of the device which would, in some instances, create additional non-devices of the device.

In some embodiments, a first product may be provided. The first product may comprise a substrate having a first surface, a first side, and a first edge where the first surface meets the first side; and a device disposed over the substrate, the device having a second side, where at least a first portion of the second side is disposed within approximately 3 mm from the first edge of the substrate. The first product may further comprise a first barrier film that covers at least a portion of the first edge of the substrate, at least a portion of the first side of the substrate, and at least the first portion of the second side of the device.

In some embodiments, in the first product as described above, at least the first portion of the second side of the device may be disposed within approximately 2 mm from the first edge of the substrate. In some embodiments, at least the first portion of the second side of the device may be disposed within approximately 1 mm from the first edge of the substrate. In some embodiments, at least the first portion of the second side of the device may be disposed within approximately 0.5 mm from the first edge of the substrate. In some embodiments, at least the first portion of the second side of the device may be disposed within approximately 0.1 mm from the first edge of the substrate.

In some embodiments, in the first product as described above, the device may comprise an active device area and an inactive device area and at least a portion of the active device area of the device may be disposed within 0.1 mm from the first edge of the substrate.

In some embodiments, in the first product as described above, the device may comprise an active device area and at least a portion of the active device area of the device may be disposed within 0.1 mm from the first edge of the substrate.

In some embodiments, in the first product as described above, the substrate may comprise any one of: a glass, a plastic, or a metal foil material.

In some embodiments, in the first product as described above, the first barrier film may comprise a mixture of polymeric material and non-polymeric material. In some embodiments, the first barrier film may comprise a mixture of polymeric silicon and inorganic silicon.

In some embodiments, in the first product as described above, the first barrier film may be disposed over at least a portion of the device. In some embodiments, the first barrier film may be disposed over the entire device.

In some embodiments, in the first product as described above, the device may comprise a plurality of sides and the first barrier film may cover each of the plurality of sides of the device. In some embodiments, the substrate may comprise a plurality of sides, and the first barrier film may cover at least a portion of each of the plurality of sides of the substrate. In some embodiments, the substrate may comprise four sides and the first barrier film may cover at least a portion of at least two of the sides of the substrate. In some embodiments, the first barrier film may be disposed over the entire device.

In some embodiments, in the first product as described above, the first product may further comprise a second barrier film that may be disposed over the device. The first barrier film and the second barrier film may comprise different materials. In some embodiments, the second barrier film may comprise a glass, plastic, a plastic coated with a barrier film, or a metal foil material.

In some embodiments, in the first product as described above, the substrate may have a first outer perimeter, and the device may have a second outer perimeter. In some embodiments, at least approximately 50% of the second outer perimeter of the device may be disposed within approximately 1 mm from the first outer perimeter of the substrate. In some embodiments, at least approximately 50% of the second outer perimeter of the device may be disposed within approximately 0.1 mm from the first outer perimeter of the substrate. In some embodiments, at least approximately 75% of the second outer perimeter of the device may be disposed within approximately 1 mm from the first outer perimeter of the substrate. In some embodiments, at least approximately 75% of the second outer perimeter of the device may be disposed within approximately 0.1 mm from the first outer perimeter of the substrate.

In some embodiments, in the first product as described above, the first barrier film may have been deposited using chemical vapor deposition CVD and an organosilicon precursor.

In some embodiments, the first product may comprise anyone of: a solar cell, a thin film battery, an organic electronic device, a lighting panel or a lighting source having a lighting panel, a display or an electronic device having a display, a mobile phone, a notebook computer, a tablet computer, or a television.

In some embodiments, in the first product as described above, the device may comprise an organic layer. In some embodiments, the device comprises an OLED.

In some embodiments, in the first product as described above, the first product may further comprise an electronics packaging, where the electronics packaging has at least a dimension that is less than that of the device. In some embodiments, the electronics packaging has a total area that is less than the total area of the device.

In some embodiments, in the first product as described above, the first product may further comprise a plurality of devices. In some embodiments, each of the plurality of devices may be disposed at a distance of less than 6.0 mm from at least one of the other devices. In some embodiments, each of the plurality of devices is disposed at a distance of less than 4.0 mm from at least one of the other devices. In some embodiments, each of the plurality of devices may be disposed at a distance of less than 2.0 mm from at least one of the other devices. In some embodiments, each of the plurality of devices may be disposed at a distance of less than 1.0 mm from at least one of the other devices.

In some embodiments, in the first product as described above, where the first product comprises a plurality of devices, the plurality of devices may be disposed on the same substrate. In some embodiments, the plurality of devices may be disposed on different substrates. In some embodiments, the plurality of devices may comprise at least two devices that emit light having a peak wavelength that is different. In some embodiments, the first product may comprise a display.

In some embodiments, in the first product as described above, the substrate may further comprise a second surface and a plurality of electrical conductors may be disposed within the substrate, where each of the plurality of conductors extends from the first surface to the second surface of the substrate. In some embodiments, each of the electrical conductors may be disposed within a micro-hole. In some embodiments, the substrate may comprise an outer perimeter and each of the plurality of conductors may be disposed within 1 mm of the outer perimeter. In some embodiments, where the substrate comprises an outer perimeter, at least one of the conductors may be disposed at a distance of greater than 1 mm from the outer perimeter of the substrate.

In some embodiments, in the first product as described above, the first product may further comprise a plurality of electrical conductors that may be disposed on the first side of the substrate. In some embodiments, the substrate may further comprise a second surface and each of the plurality of conductors may extend from the first surface to the second surface of the substrate.

In some embodiments, in the first product as described above where the substrate comprises a second surface and a plurality of conductors either disposed within the substrate or disposed on the first side of the substrate, the first product may further comprise a plurality of electrodes disposed over the substrate. In some embodiments, each of the plurality of electrical conductors may be electrically connected to at least one of the plurality of electrodes. In some embodiments, the electrical connection between the plurality of electrodes and the plurality of electrical conductors may comprise a patterned conductive trace disposed on the first surface of the substrate.

In some embodiments, a first product may be provided that comprises a first substrate having a first surface, a first side, and a first edge where the first surface meets the first side; a second substrate having a first surface, a first side, and a first edge where the first surface meets the first side; and a plurality of devices that comprises a first device and a second device. The first device may be disposed over the first substrate and have a second side, where at least a first portion of the second side of the first device is disposed within approximately 3.0 mm from the first edge of the first substrate. The first product may further comprise a first barrier film that covers at least a portion of the first edge of the first substrate, at least a portion of the first side of the first substrate, and at least the first portion of the second side of the first device. The second device may be disposed over the second substrate and have a have a second side, where at least a first portion of the second side of the second device is disposed within approximately 3.0 mm from the first edge of the second substrate. The first product may further include a second barrier film that covers at least a portion of the first edge of the second substrate, at least a portion of the first side of the second substrate, and at least the first portion of the second side of the second device.

In some embodiments, in the first product as described above, the first portion of the second side of the first device may be disposed at a distance of less than 6.0 mm of the first portion of the second side of the second device. In some embodiments, the first portion of the second side of the first device may be disposed at a distance of less than 2.0 mm of the first portion of the second side of the second device. In some embodiments, the first portion of the second side of the first device may be disposed at a distance of less than 1.0 mm of the first portion of the second side of the second device.

In some embodiments, in the first product as described above, the first device may comprise an active device area and an inactive device area; the second device may comprise an active device area and an inactive device area; and at least a portion of the active device area of the first device is disposed at a distance of less than 1.0 mm of at least a portion of the active device area of the second device.

In some embodiments, in the first product as described above, the first device may comprise an active device area; the second device may comprise an active device area; and at least a portion of the active device area of the first device may be disposed at a distance of less than 0.01 mm of at least a portion of the active device area of the second device.

Embodiments may also provide a first method. The first method may include the steps of providing a substrate having: a first surface, a first side, and a first edge where the first surface meets the first side; and a device disposed over the first surface of the substrate, the device having a second side. At least a first portion of the second side of the device may be disposed not more than 3.0 mm from the first edge of the substrate. After providing the substrate, the first method further includes the step of depositing a first barrier film so as to cover at least a portion of the first edge of the substrate, at least a portion of the first side of the substrate, and at least the first portion of the second side of the device.

In some embodiments, in the first method as described above, at least the first portion of the second side may be disposed not more than 2.0 mm from the first edge. In some embodiments, at least the first portion of the second side may be disposed not more than 1.0 mm from the first edge. In some embodiments, at least the first portion of the second side may be disposed not more than 0.5 mm from the first edge. In some embodiments, at least the first portion of the second side may be disposed not more than 0.1 mm from the first edge.

In some embodiments, in the first method as described above, the device may comprise an active device area; and at least a portion of the active device area of the device may be disposed within 0.1 mm from the first edge of the substrate.

In some embodiments, in the first method as described above, the first barrier film may comprise a mixture of polymeric material and non-polymeric material. In some embodiments, the first barrier film may comprise a mixture of polymeric silicon and inorganic silicon.

In some embodiments, in the first method as described above, the step of providing a substrate may include the steps of: scribing the substrate at a plurality of positions, depositing the device over the first surface of the substrate, and breaking the substrate at the plurality of scribed positions. In some embodiments, the step of breaking the substrate may be performed before the device is deposited over the first surface of the substrate. In some embodiments, the step of breaking the substrate may be performed after the device is deposited over the first surface of the substrate.

In some embodiments, in the first method as described above, the step of providing a substrate may include the steps of: depositing the device over the first surface of the substrate; after the device is deposited, scribing the substrate and the device at a plurality of positions; and breaking the substrate and the device at the plurality of scribed positions.

In some embodiments, in the first method as described above, the step of providing a substrate may include the step of depositing the device over the entire first surface of the substrate. In some embodiments, the step of providing a substrate may include the step of depositing the device through a mask having an opening that is larger than the first surface of the substrate.

In some embodiments, in the first method as described above, the step of providing a substrate may include the steps of: depositing the device over the first surface of the substrate; and after the device is deposited, breaking the substrate and the device at a plurality of places. In some embodiments, the step of breaking the substrate and the device may comprise cutting the device and the substrate.

In some embodiments, in the first method as described above, the step of providing a substrate may include the steps of: depositing the device over the first surface of the substrate; after the device is deposited, ablating a portion of the active to expose the second side of the device; and after the device is deposited, ablating a portion of the substrate to expose the first side.

In some embodiments, in the first method as described above, after depositing the first barrier film, the method may further comprise the step of breaking the substrate.

In some embodiments, in the first method as described above, the first method may further comprise the step of forming a plurality of conductive paths from the first surface of the substrate to a second surface of the substrate. In some embodiments, the step of forming a plurality of conductive paths may include the steps of: fabricating a plurality of vias in the substrate from the first surface to the second surface; and disposing conductive material in each of the plurality of vias.

In some embodiments, in the first method as described above comprising the step of forming a plurality of conductive paths from the first surface of the substrate to a second surface of the substrate, the step of forming a plurality of conductive paths may comprise disposing conductive material on the first side of the substrate. In some embodiments, the step of disposing conductive material on the first side of the substrate comprises any one of, or some combination of: direct printing the conductive material over a portion of the first side to for the plurality of conductive paths; disposing a conductive layer over at least a portion of the first side and patterning the conductive layer to form the plurality of conductive paths; depositing a conductive layer to form the plurality of conductive paths using a vacuum process; and/or dipping the first side of the substrate into a conductive material so as to form the plurality of conductive paths.

Embodiments may also provide a first product prepared by a process. The process may include the steps of providing a substrate having a first surface, a first side, and a first edge where the first surface meets the first side; and a device disposed over the first surface of the substrate having a second side, where at least a first portion of the second side is disposed not more than 1.0 mm from the first edge. The process may further include the step of depositing a first barrier film so as to cover at least a portion of the first edge of the substrate, at least a portion of the first side of the substrate, and at least the first portion of the second side.

In some embodiments, in the first product prepared by the process as described above, the first barrier film may comprise a mixture of polymeric material and non-polymeric material.

In some embodiments, in the first product prepared by the process as described above, the step of depositing the first barrier film may comprise using an organosilicon precursor. In some embodiments, the step of depositing the first barrier film may comprise chemical vapor deposition CVD. In some embodiments, the chemical vapor deposition may be plasma-enhanced.

In some embodiments, in the first product prepared by the process as described above where the step of depositing the first barrier film comprise vapor deposition using an organosilicon precursor, the barrier film may consist essentially of a mixture of polymeric silicon and inorganic silicon. In some embodiments, the weight ratio of polymeric silicon to inorganic silicon may be in the range of 95:5 to 5:95. In some embodiments, the polymeric silicon and the inorganic silicon may be created from the same precursor material. In some embodiments, at least a 0.1 μm thickness of the barrier film may be deposited under the same reaction conditions for all the reaction conditions in the deposition process. In some embodiments, the water vapor transmission rate may be less than $10^{-6}$ g/m$^2$/day through the at least 0.1 μm thickness of the barrier film.

In some embodiments, in the first product prepared by the process as described above where the step of depositing the first barrier film comprise vapor deposition using an organosilicon precursor, the precursor material may comprise hexamethyl disiloxane or dimethyl siloxane. In some embodiments, the precursor material may comprise a single organosilicon compound. In some embodiments, the precursor material comprises a mixture of organosilicon compounds.

Embodiments may also provide a first product. The first product may comprise a substrate having a first surface, a first side, and a first edge where the first surface meets the first side; and a device disposed over the substrate having a second side; wherein at least a first portion of the second side is disposed within approximately 1.0 mm from the first edge of the substrate. The device may comprise a first organic material. In some embodiments, no portion of the first side of the first substrate is covered by more than $6 \times 10^{13}$ atoms/cm$^2$ of the first organic material.

In some embodiments, in the first product as described above, the first organic material does not cover any portion of the first side of the substrate.

In some embodiments, the first product as described above may further comprise a first barrier film that covers at least a portion of the first edge of the substrate, at least a portion of the first side of the substrate, and at least the first portion of the second side of the device.

In some embodiments, in the first product as described above, at least the first portion of the second side of the device may be disposed within approximately 0.1 mm from the first edge of the substrate.

Embodiments may also provide a first method. The first method may include the steps of providing a substrate having: a first surface, a first side, and a first edge where the first surface meets the first side; and a device disposed over a first surface of the substrate; and breaking the device so as to expose a second side of the device such that at least a first portion of the device is disposed not more than 3.0 mm from the first edge. In some embodiments, at least the first portion of the device may be disposed not more than 2.0 mm from the first edge. In some embodiments, at least the first portion of the device may be disposed not more than 1.0 mm from the first edge. In some embodiments, at least the first portion of the device is disposed not more than 0.1 mm from the first edge.

In some embodiments, in the first method as described above, the device may comprise an active device area; and at least a portion of the active device area of the device may be disposed not more than 0.1 mm from the first edge of the substrate.

In some embodiments, in the first method as described above, the step of providing a substrate having a first side and a first edge may include the step of breaking the substrate along the first side. In some embodiments, the steps of breaking the substrate and breaking the device may comprise the same step.

In some embodiments, in the first method as described above and after the step of breaking the device, the method may further comprise the step of depositing a first barrier film so as to cover at least a portion of the first edge of the substrate, at least a portion of the first side of the substrate, and at least the first portion of the second side of the device. In some embodiments, the steps of breaking the device and depositing a first barrier film may be performed in a vacuum. In some embodiments, the first barrier film may comprise a mixture of polymeric silicon and inorganic silicon.

In some embodiments, the step of breaking the device may comprise cutting the device.

DETAILED DESCRIPTION OF THE INVENTION

Generally, an OLED comprises at least one organic layer disposed between and electrically connected to an anode and a cathode. When a current is applied, the anode injects holes and the cathode injects electrons into the organic layer(s). The injected holes and electrons each migrate toward the oppositely charged electrode. When an electron and hole localize on the same molecule, an "exciton," which is a localized electron-hole pair having an excited energy state, is formed. Light is emitted when the exciton relaxes via a photoemissive mechanism. In some cases, the exciton may be localized on an excimer or an exciplex. Non-radiative mechanisms, such as thermal relaxation, may also occur, but are generally considered undesirable.

The initial OLEDs used emissive molecules that emitted light from their singlet states ("fluorescence") as disclosed, for example, in U.S. Pat. No. 4,769,292, which is incorporated by reference in its entirety. Fluorescent emission generally occurs in a time frame of less than 10 nanoseconds.

More recently, OLEDs having emissive materials that emit light from triplet states ("phosphorescence") have been demonstrated. Baldo et al., "Highly Efficient Phosphorescent Emission from Organic Electroluminescent Devices," Nature, vol. 395, 151-154, 1998; ("Baldo-I") and Baldo et al., "Very high-efficiency green organic light-emitting devices based on electrophosphorescence," Appl. Phys. Lett., vol. 75, No. 3, 4-6 (1999) ("Baldo-II"), which are incorporated by reference in their entireties. Phosphorescence is described in more detail in U.S. Pat. No. 7,279,704 at cols. 5-6, which are incorporated by reference.

Figure 1:
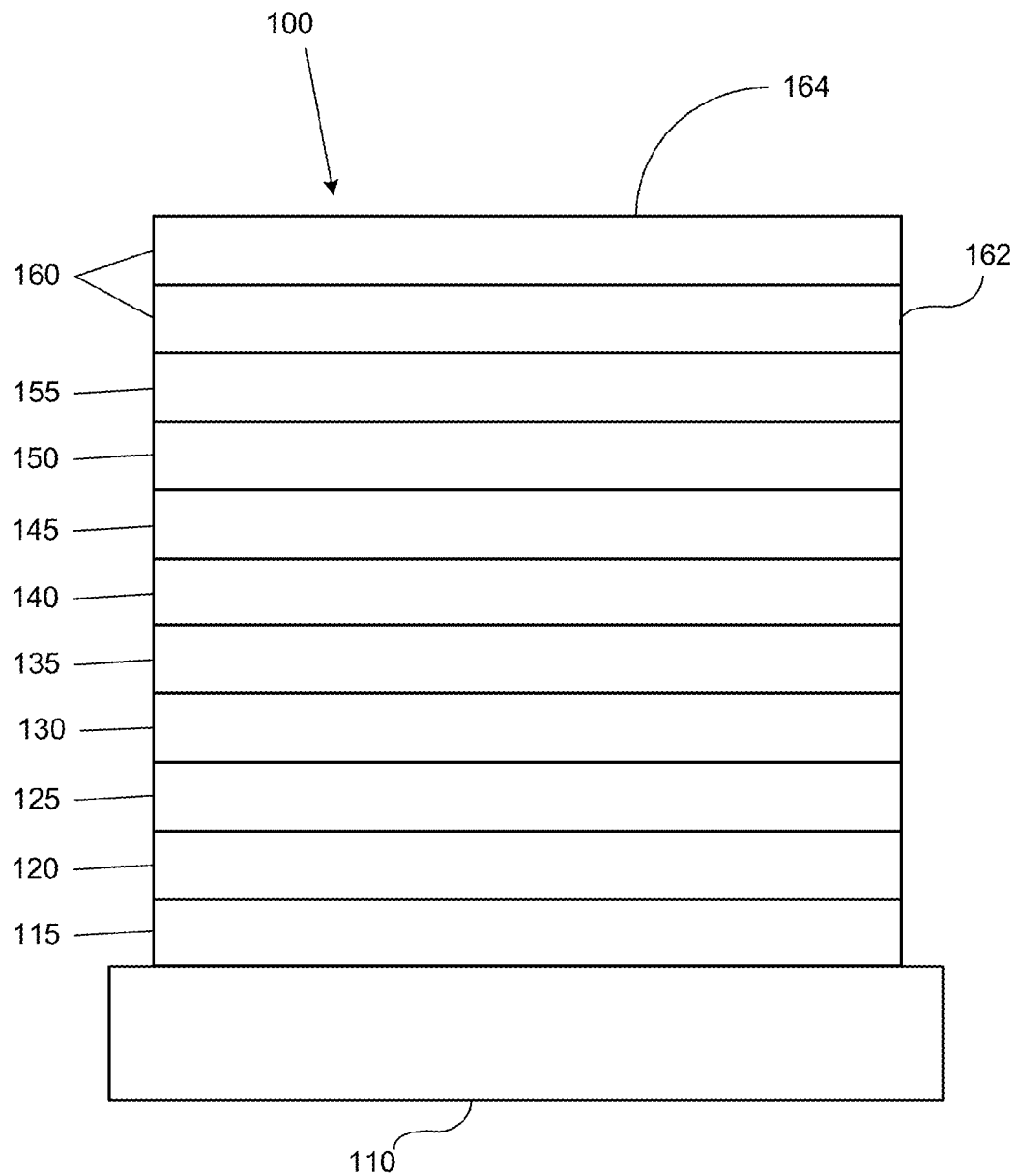
FIG. 1 shows an organic light emitting device.

FIG. 1 shows an organic light emitting device 100. The figures are not necessarily drawn to scale. Device 100 may include a substrate 110, an anode 115, a hole injection layer 120, a hole transport layer 125, an electron blocking layer 130, an emissive layer 135, a hole blocking layer 140, an electron transport layer 145, an electron injection layer 150, a protective layer 155, and a cathode 160. Cathode 160 is a compound cathode having a first conductive layer 162 and a second conductive layer 164. Device 100 may be fabricated by depositing the layers described, in order. The properties and functions of these various layers, as well as example materials, are described in more detail in U.S. Pat. No. 7,279,704 at cols. 6-10, which are incorporated by reference.

More examples for each of these layers are available. For example, a flexible and transparent substrate-anode combination is disclosed in U.S. Pat. No. 5,844,363, which is incorporated by reference in its entirety. An example of a p-doped hole transport layer is m-MTDATA doped with F.sub.4-TCNQ at a molar ratio of 50:1, as disclosed in U.S. Patent Application Publication No. 2003/0230980, which is incorporated by reference in its entirety. Examples of emissive and host materials are disclosed in U.S. Pat. No. 6,303,238 to Thompson et al., which is incorporated by reference in its entirety. An example of an n-doped electron transport layer is BPhen doped with Li at a molar ratio of 1:1, as disclosed in U.S. Patent Application Publication No. 2003/0230980, which is incorporated by reference in its entirety. U.S. Pat. Nos. 5,703,436 and 5,707,745, which are incorporated by reference in their entireties, disclose examples of cathodes including compound cathodes having a thin layer of metal such as Mg:Ag with an overlying transparent, electrically-conductive, sputter-deposited ITO layer. The theory and use of blocking layers is described in more detail in U.S. Pat. No. 6,097,147 and U.S. Patent Application Publication No. 2003/0230980, which are incorporated by reference in their entireties. Examples of injection layers are provided in U.S. Patent Application Publication No. 2004/0174116, which is incorporated by reference in its entirety. A description of protective layers may be found in U.S. Patent Application Publication No. 2004/0174116, which is incorporated by reference in its entirety.

Figure 2:
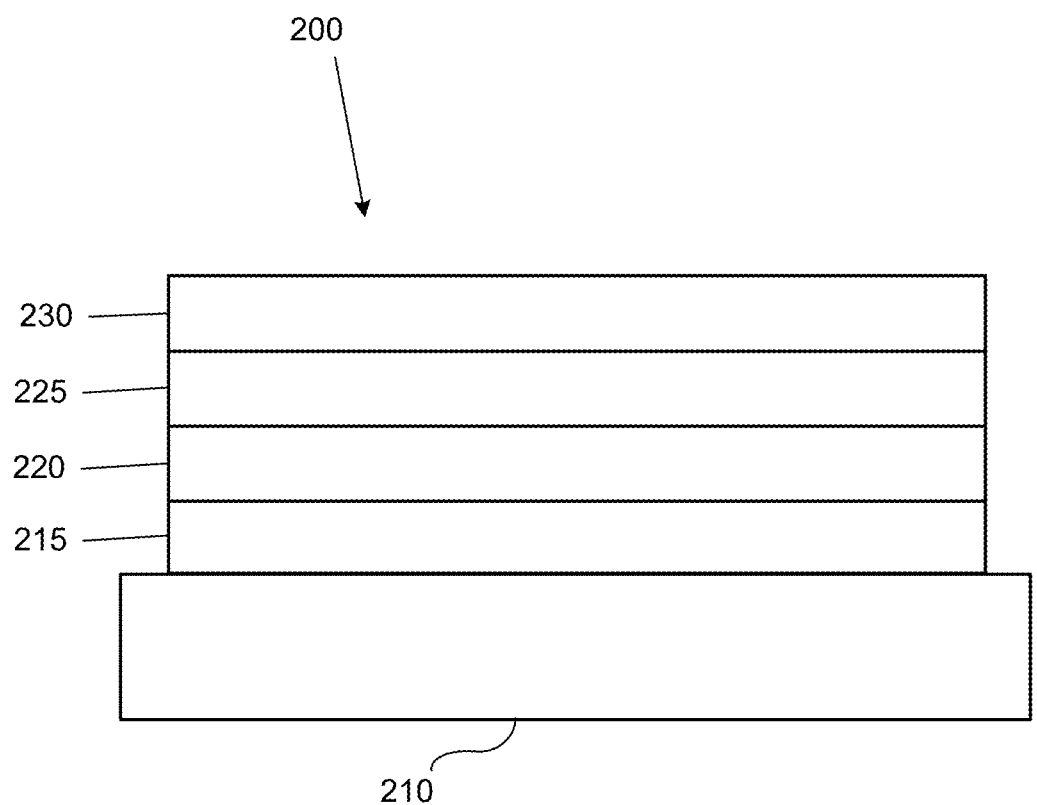
FIG. 2 shows an inverted organic light emitting device that does not have a separate electron transport layer.

FIG. 2 shows an inverted OLED 200. The device includes a substrate 210, a cathode 215, an emissive layer 220, a hole transport layer 225, and an anode 230. Device 200 may be fabricated by depositing the layers described, in order. Because the most common OLED configuration has a cathode disposed over the anode, and device 200 has cathode 215 disposed under anode 230, device 200 may be referred to as an "inverted" OLED. Materials similar to those described with respect to device 100 may be used in the corresponding layers of device 200. FIG. 2 provides one example of how some layers may be omitted from the structure of device 100.

The simple layered structure illustrated in FIGS. 1 and 2 is provided by way of non-limiting example, and it is understood that embodiments of the invention may be used in connection with a wide variety of other structures. The specific materials and structures described are exemplary in nature, and other materials and structures may be used. Functional OLEDs may be achieved by combining the various layers described in different ways, or layers may be omitted entirely, based on design, performance, and cost factors. Other layers not specifically described may also be included. Materials other than those specifically described may be used. Although many of the examples provided herein describe various layers as comprising a single material, it is understood that combinations of materials, such as a mixture of host and dopant, or more generally a mixture, may be used. Also, the layers may have various sublayers. The names given to the various layers herein are not intended to be strictly limiting. For example, in device 200, hole transport layer 225 transports holes and injects holes into emissive layer 220, and may be described as a hole transport layer or a hole injection layer. In one embodiment, an OLED may be described as having an "organic layer" disposed between a cathode and an anode. This organic layer may comprise a single layer, or may further comprise multiple layers of different organic materials as described, for example, with respect to FIGS. 1 and 2.

Structures and materials not specifically described may also be used, such as OLEDs comprised of polymeric materials (PLEDs) such as disclosed in U.S. Pat. No. 5,247,190 to Friend et al., which is incorporated by reference in its entirety. By way of further example, OLEDs having a single organic layer may be used. OLEDs may be stacked, for example as described in U.S. Pat. No. 5,707,745 to Forrest et al, which is incorporated by reference in its entirety. The OLED structure may deviate from the simple layered structure illustrated in FIGS. 1 and 2. For example, the substrate may include an angled reflective surface to improve out-coupling, such as a mesa structure as described in U.S. Pat. No. 6,091,195 to Forrest et al., and/or a pit structure as described in U.S. Pat. No. 5,834,893 to Bulovic et al., which are incorporated by reference in their entireties.

Unless otherwise specified, any of the layers of the various embodiments may be deposited by any suitable method. For the organic layers, preferred methods include thermal evaporation, ink-jet, such as described in U.S. Pat. Nos. 6,013,982 and 6,087,196, which are incorporated by reference in their entireties, organic vapor phase deposition (OVPD), such as described in U.S. Pat. No. 6,337,102 to Forrest et al., which is incorporated by reference in its entirety, and deposition by organic vapor jet printing (OVJP), such as described in U.S. patent application Ser. No. 10/233,470, which is incorporated by reference in its entirety. Other suitable deposition methods include spin coating and other solution based processes. Solution based processes are preferably carried out in nitrogen or an inert atmosphere. For the other layers, preferred methods include thermal evaporation. Preferred patterning methods include deposition through a mask, cold welding such as described in U.S. Pat. Nos. 6,294,398 and 6,468,819, which are incorporated by reference in their entireties, and patterning associated with some of the deposition methods such as ink jet and OVJP. Other methods may also be used. The materials to be deposited may be modified to make them compatible with a particular deposition method. For example, substituents such as alkyl and aryl groups, branched or unbranched, and preferably containing at least 3 carbons, may be used in small molecules to enhance their ability to undergo solution processing. Substituents having 20 carbons or more may be used, and 3-20 carbons is a preferred range. Materials with asymmetric structures may have better solution processibility than those having symmetric structures, because asymmetric materials may have a lower tendency to recrystallize. Dendrimer substituents may be used to enhance the ability of small molecules to undergo solution processing.

Devices fabricated in accordance with embodiments of the invention may be incorporated into a wide variety of consumer products, including flat panel displays, computer monitors, televisions, billboards, lights for interior or exterior illumination and/or signaling, heads up displays, fully transparent displays, flexible displays, laser printers, telephones, cell phones, personal digital assistants (PDAs), laptop computers, digital cameras, camcorders, viewfinders, micro-displays, vehicles, a large area wall, theater or stadium screen, lighting fixtures, or a sign. Various control mechanisms may be used to control devices fabricated in accordance with the present invention, including passive matrix and active matrix. Many of the devices are intended for use in a temperature range comfortable to humans, such as 18 degrees C. to 30 degrees C., and more preferably at room temperature (20-25 degrees C.).

The materials and structures described herein may have applications in devices other than OLEDs. For example, other optoelectronic devices such as organic solar cells and organic photodetectors may employ the materials and structures. More generally, organic devices, such as organic transistors, may employ the materials and structures.

The terms halo, halogen, alkyl, cycloalkyl, alkenyl, alkynyl, arylkyl, heterocyclic group, aryl, aromatic group, and heteroaryl are known to the art, and are defined in U.S. Pat. No. 7,279,704 at cols. 31-32, which are incorporated herein by reference.

As used herein, the "active device area" of a device may refer to the portion of the device in which electrons, holes, and/or photons are generated or absorbed and may comprise one or more organic and/or semi-conductor materials (such as organic semi-conductors or doped silicon). For organic electronic devices, the active device area may comprise one or more organic layers. For example, the active device area of an OLED may refer to the emissive area of the device (i.e. the portion of the device that emits light) and may include an organic electroluminescent material. The active device area of a solar cell may refer to the portion of the device where photons are absorbed and electrons are released (e.g. it may refer to the portion of the device that comprises a semiconductor material). For a thin film battery, the active device area may refer to the electrolyte and may comprise, for example, lithium phosphorus oxynitride. These are just a few examples of active device areas of exemplary devices, and it should be appreciated that embodiments disclosed herein are not so limited.

As used herein, the term "approximately" may refer to plus or minus 10 percent, inclusive. Thus, the phrase "approximately 10 mm" may be understood to mean from 9 mm to 11 mm, inclusive.

As used herein, a "barrier film" or "barrier layer" may refer to a layer of material that may be utilized to decrease the permeation of gases, vapors, and/or moisture (or other environmental particulates) into the active device area of the device so as to increase lifetime and/or reduce performance degradation. In some embodiments, the barrier film may comprise a hybrid layer comprising a mixture of a polymeric material and a non-polymeric material. As used herein, the term "non-polymeric" refers to a material made of molecules having a well-defined chemical formula with a single, well-defined molecular weight. A "nonpolymeric" molecule can have a significantly large molecular weight. In some circumstances, a non-polymeric molecule may include repeat units. As used herein, the term "polymeric" refers to a material made of molecules that have repeating subunits that are covalently linked, and that has a molecular weight that may vary from molecule to molecule because the polymerizing reaction may result in different numbers of repeat units for each molecule. For example, in some embodiments, the barrier film may comprise a mixture of polymeric silicon and inorganic silicon. Examples of barrier films are described in more detail below.

As used herein, the "border area" (i.e. dead space) of the device may comprise the combination of the "inactive device area" and the "non-device edge area." As used in this context, the "thickness" of the border area may refer to the distance from the device footprint to the edge of the border area (which may also comprise the edge of the substrate in some embodiments) in a direction that is perpendicular to a side of the device footprint.

As used herein, the term "comprising" is not intended to be limiting, but may be a transitional term synonymous with "including," "containing," or "characterized by." The term "comprising" may thereby be inclusive or open-ended and does not exclude additional, unrecited elements or method steps when used in a claim. For instance, in describing a method, "comprising" indicates that the claim is open-ended and allows for additional steps. In describing a device, "comprising" may mean that a named element(s) may be essential for an embodiment, but other elements may be added and still form a construct within the scope of a claim. In contrast, the transitional phrase "consisting of" excludes any element, step, or ingredient not specified in a claim. This is consistent with the use of the term throughout the specification.

As used herein, a "device" may comprise any component that may be deposited (either as a single or multiple layers) over a substrate and may provide a desired functionality based on the application of a voltage, current, or photon exposure (e.g. solar cell). The device may comprise an "active device area" (where electrons, holes, and/or photons are generated or absorbed) and an "inactive device area." With reference to an organic devices for illustration purposes, the "device" may refer to the one or more organic layers, one or more insulating grid layers, electrodes, and any layers disposed between the electrodes as shown in the examples of FIGS. 1 and 2. An example of a device is an OLED. As used herein, the device does not include one or more electrical contacts that may extend away from the active device area and the inactive device area. That is, for instance, any portion of one or more electrodes that extends such that it is not disposed within the device footprint does not comprise a portion of the device (e.g. such portions may form an electrical contact).

As used herein, the "device footprint" may refer to the total area of the "active device area" of the device and the "inactive device area" of the device. With reference to an organic device for illustration purposes, the device footprint may refer to the portion of the device in which one or more organic layers (i.e. the organic footprint) and/or one or more insulating grid layers are disposed over the substrate.

As used herein, the "inactive device area" of a device may refer to portions of the device that comprises one or more layers of materials (such as organic layers) that are also included in the active area, but which does not comprise a part of the device where electrons, holes, and/or photons are generated or absorbed (i.e. it is not a part of the active device area of the device). For example, with regard to an OLED, the inactive device area may include one or more organic layers and/or a portion of an electrode, but this portion of the device may not include one or more of the other organic layers (or one or more electrodes) and therefore does not emit light. The inactive device area is often, but not always, the result of depositing an organic layer so as to extend beyond the edges of one of the electrodes to prevent or reduce the likelihood of shorting. In some instances, an insulating layer (e.g. "grid layer") may be disposed over the substrate and a portion of an electrode so as to electrically insulate the conductive layers of the device. These areas generally do not emit light and therefore would comprise a portion of the "inactive device area." In most instances, the inactive device area of the device is disposed adjacent to one or more sides of the active device area. However, embodiments are not so limited and in some instances a device may have inactive device areas disposed between active device areas (e.g. an AMOLED display may have non-emissive areas between pixels that may comprise: inactive device areas").

As used herein, a "non-device edge area" may refer to the area around the device footprint—that is, the portion of a product that does not include the "active device area" or the "inactive device area" of the device. For example, the non-device edge area may not comprise one or more of the layers that of the active device area of the device. With reference to organic electronic devices, the non-device edge area may refer to the portion of product that typically does not comprise an organic layer or an insulating layer (such as a grid layer that is disposed over one of the electrodes of the OLED). For instance, the non-device edge area may refer to the non-emitting areas of the OLED that do not comprise a part of the inactive device area (e.g. The non-device edge area may include the portions of the product in which one or more barrier films or layers are disposed along a side of the device footprint.

As used herein, the "perpendicular length" of the barrier film may refer to the distance from a portion of the barrier film that is disposed closest to the device footprint (e.g. adjacent to the active device area or inactive device area in some instances) to another portion of the barrier film that is disposed farthest away from the device footprint (e.g. an edge of the barrier film) in a direction that is perpendicular to the side of the device footprint and parallel to the surface of the substrate that the device is disposed over. In other words, the perpendicular length may be a measure of the distance that the barrier film extends away from the device footprint. The reason for utilizing the "side" of the device footprint as determining the perpendicular length is to generally exclude the corner effects, where the length of the barrier film may vary because of the shape of the device footprint. Thus, in general, the perpendicular length may correspond to the length of the barrier film disposed so as to provide resistance to the horizontal ingress of moisture (and other contaminants) into the active device area.

As used herein, the term "product" is used to be an inclusive term that can comprise a device (such as an OLED, thin film batter, solar cell, etc.) with additional components or components (e.g. barrier layers disposed thereon), a plurality of devices disposed or arranged on a single substrate or multiple substrates, or a single device. Thus, in some instances a "product" may be used interchangeable with "device" or "electronic device." A product may include consumer devices (as defined above).

It should be noted that although embodiments described below may make reference to organic devices such as OLEDs, embodiments are not so limited. The inventors have found that barrier films comprising disposed as described below as an edge sealant may be generally used in any thin film electronic device, particularly those that may have a component (or components) that is sensitive to environmental permeants such as water vapor. Moreover, the inventors have found that the disposition and configuration of a barrier film as claimed herein used as an edge sealant may provide devices where the device may be disposed within 3.0 mm (preferably less than 2.0 mm; more preferably less than 1.0 mm; and more preferably less than 0.1 mm) of an edge of the substrate, while still providing adequate device performance and lifetime. This reduction in the distance between a side of the device and an edge of the substrate may reduce the size of the non-devices of such devices and thereby potentially reduce the overall size of an electronic device that comprises the barrier film disposed as described herein. In some instances, that active device area of a device may be disposed within 0.1 mm from the edge of the substrate (which may further reduce the appearance of any border area, whether created by the non-device edge area (e.g. from a barrier layer) or inactive device area of the device (e.g. from a grid layer).

It should be noted that although embodiments described below may make reference to organic devices such as OLEDs, embodiments are not so limited. The inventors have found that barrier films as provided herein may be generally used in any thin film electronic device, particularly those that may have a component (or components) that is sensitive to environmental permeants such as water vapor. Moreover, the inventors have found that the exemplary barrier film may enable devices to be disposed within 3.0 mm (preferably within than 2.0 mm; and more preferably within 1.0 mm) of an edge of the substrate, while still providing adequate device performance and lifetime.

In general, electronic devices having moisture sensitive electronic components (such as water vapor sensitive electrodes) may degrade upon storage because of the atmospheric conditions. The degradation may be in the form of dark spots caused by the ingress of water vapor and oxygen vertically through the bulk of a thin film encapsulation (TFE) (or through particles embedded in the TFE), or by the ingress of water vapor and oxygen horizontally through the edge of the TFE. The TFE may also be referred to herein as a barrier layer or barrier film. The edge ingress of the water vapor typically occurs either via the horizontal permeation of the permeants (e.g. water vapor molecules) through the TFE itself (see, e.g., FIG. 6, 604 described below) or via the horizontal permeation of the permeants through the interface of the TFE with the underlying substrate (see, e.g., FIG. 6, 605 described below). The inventors have thereby found that it is preferred that a TFE providing an edge seal for an electronic device reduces both types of horizontal permeations (i.e. permeation across the layer itself and permeation at the interface between the layer and the substrate). In this regard, embodiments provided herein comprise an edge seal that may provide for improved performance and may be used for electronic devices that may be sensitive to atmosphere conditions, such as moisture.

Previous edge seals that were widely in use utilized multilayer barriers. For example, many devices comprised multilayer barriers that consisted of alternate layers of inorganic and polymer films. These barriers work on the principle of delaying the permeant molecules from reaching the device by forming a long and tortuous diffusion path. Some examples of these multilayer barriers will be described below.

Figure 3:
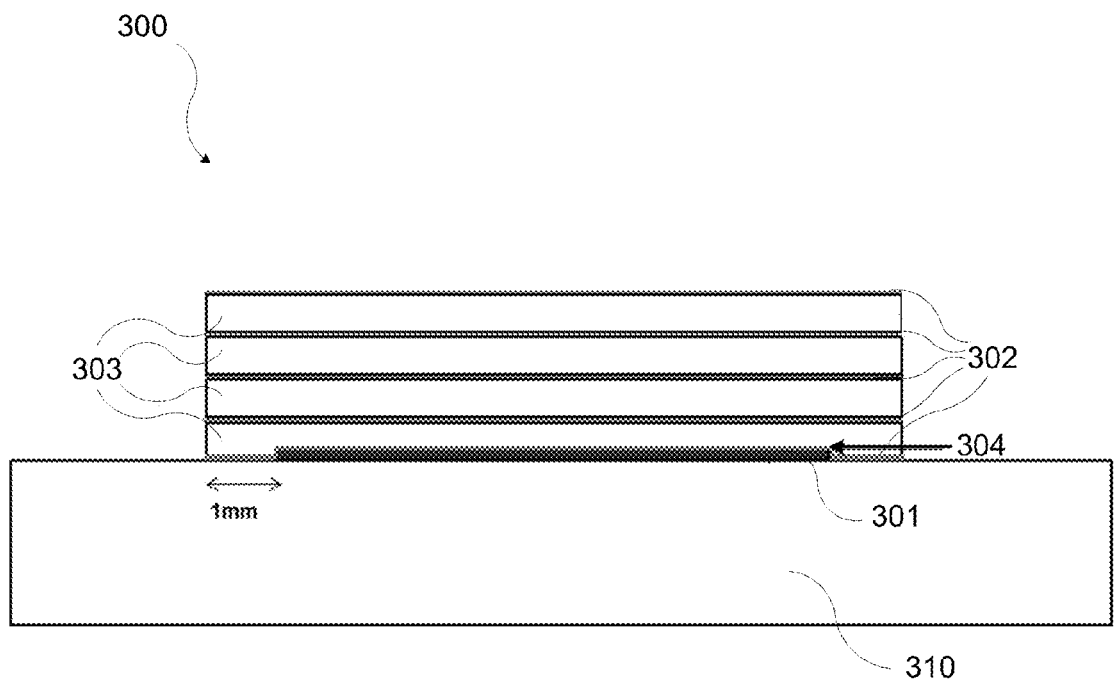
FIG. 3 shows a cross-section of an exemplary device having a multilayer barrier. The footprints of the deposition masks used for both inorganic and polymer films may be the same, which is larger than the device footprint by, for example, 1 mm in this exemplary device.

One of the prior methods for encapsulating a device with a multilayer barrier utilizes the same mask for both the inorganic and the polymer films; however, the size of the mask is larger than the footprint of a device so as to provide some edge ingress barrier (and also to allow for mask alignment tolerance). Assuming an alignment tolerance of 500 μm (which is reasonable for most fabrication processes) for both the device mask (e.g. the mask that may be used to deposit the layers that forth the active device area, inactive device area, and/or other components such as electrodes) and the encapsulation mask (e.g. the mask used to deposit the inorganic and the polymer films), this implies that the encapsulation mask should be about 1.0 mm larger than the device mask so as to prevent any device exposure when both the deposition of the device and the alignment of the encapsulation mask is off in the worst case scenario. It may also be assumed that the thickness of the inorganic film of the multilayer barrier is about 50 nm, and the thickness of the polymer film of multilayer barrier is about 800 nm, as is typically the case for such devices. FIG. 3 provides an example of such a device.

FIG. 3 shows a product 300 that comprises a substrate 310, a device 301 having a device footprint (which may include an active device area and an inactive device area) disposed over the substrate 310, and a plurality of inorganic layers 302 and polymer layers 303 that encapsulate the device 301. The product 300 of FIG. 3 shows a multilayer barrier encapsulation process consisting of a 5-layer stack that includes five inorganic layers (302) with four polymer layers (303) disposed between the organic layers (i.e. sandwiched between). In general, this type of masking and deposition method may be relatively simple to fabricate because it uses a minimum number of mask changes (thus adding minimum processing time for fabrication)—i.e. after the device 301 and corresponding components are deposited on the substrate, both the inorganic layer and the polymer layer may be deposited through a single mask. As shown in FIG. 3, this exemplary multi-layer barrier provides a direct path (i.e. Path-1 shown by the arrow 304) for water vapor to travel across the polymer layer 303 horizontally and reach the device 301 of product 300 (e.g. an environmentally sensitive electrode or organic layer) by permeating across just one inorganic layer 302 (i.e. the inorganic layer disposed adjacent to the device footprint of the device 301). Thus, the edge seal provided by this type of multilayer barrier as shown in FIG. 3 is mostly dependent on the permeation rate of water vapor across the polymer material 303 (which is typically higher than the permeation rate of the inorganic material). In general, for device designs such as those shown in FIG. 3, to achieve suitable device performance and lifetime, such a device would use a footprint for the encapsulation layer (e.g. the polymer 303 and inorganic 302 layers) that is much larger than the footprint of device 301. That is, the use of a single mask size for both inorganic 302 and organic 303 films that is larger than the device footprint to deposit the edge seal may not be a working or practical solution to providing a device with a minimal amount of border area (i.e. dead space). This is further illustrated in the example provided below.

The value of the diffusion constant of water vapor in polyacrylate polymer (a commonly used encapsulation material) at 25° C. can be calculated by using the diffusion constant ("D") of polyacrylate polymer at 38° C. as calculated by G. L. Graff, R. E. Williford, and P. E. Burrows, *Mechanisms of vapor permeation through multilayer barrier films: Lag time versus equilibrium permeation*, J. Appl. Phys., 96 (4), pp. 1840-1849 (2004) (i.e. the diffusion constant (D) at 38° C.~8.5×10$^{-9}$ cm$^2$/sec), which is incorporated herein by reference in its entirety, and utilizing the activation energy of water vapor in such a polymer as was calculated by Z. Chen, Q. Gu, H. Zou, T. Zhao, H. WANG, *Molecular Dynamics Simulation of Water Diffusion Inside an Amorphous Polyacrylate Latex Film*, Journal of Polymer Science: Part B: Polymer Physics, Vol. 45, 884-891 (2007) (found to be approximately equal to 13 kJ/mole), which is also incorporated herein by reference in its entirety. In this manner, the diffusion constant of water vapor in polyacrylate polymer at 25° C. can be estimated to be ~6.8×10$^{-9}$ cm$^2$/sec. Using this diffusion constant, the lag time of water vapor diffusion through Path-1 (304) for the device 300 shown in FIG. 3 can be estimated. As used in this context, the lag time ($t_l$) refers to the approximate diffusion time of permeant molecules (e.g. water vapor molecules) across a distance (l), and is related to the diffusion constant of the material by the relation given by: $t_l=l^2/(6D)$, as shown by Graff et al., *Mechanisms of vapor permeation through multilayer barrier films: Lag time versus equilibrium permeation*, J. Appl. Phys., 96 (4), pp. 1840-1849 (2004). Using the diffusion constant (D) of water vapor in polyacrylate polymer calculated above, the lag time at 25° C. may be calculated to be close to 70 hours for a path length of 1.0 mm. That is, for the exemplary encapsulation method shown in FIG. 3, it would generally take water vapor approximately 70 hours at room temperature to reach the inorganic layer 302 adjacent to the footprint of device 301 of the product 300 when traveling horizontally along Path-1 (304). Once the permeant crosses the polymer layer 303 along Path-1 (304), it need only permeate across just a single inorganic film layer 302 (which typically has a thickness of approximately 50 nm) to reach the footprint of device 301. The permeants can then reach the active device area quickly through defects (e.g. pinholes, cracks, particles, etc.) and cause damage. Needless to say, this design may result in device degradation that is unacceptable for an intended purpose or application.

Figure 4:
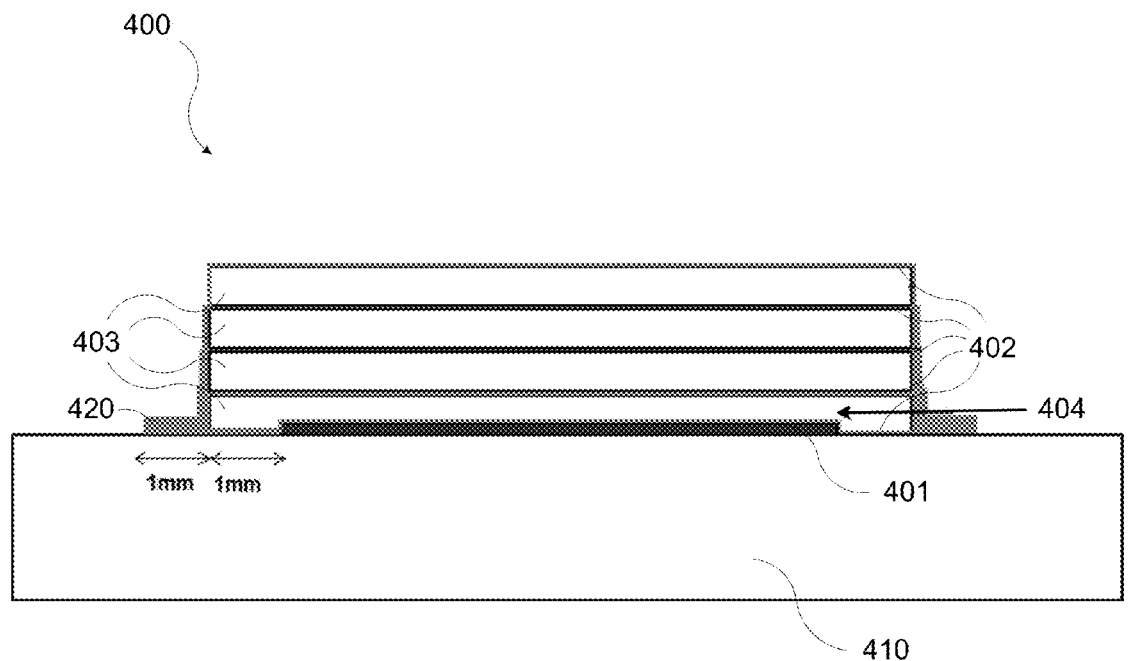
FIG. 4 shows a cross-section of an exemplary device having a multilayer barrier. The footprint of the mask used for the polymer film may be larger than the device footprint by, for example, 1 mm, and the footprint of the mask of the inorganic film may be larger than that of the polymer film by, for example, 1 mm.

Another approach using a multilayer barrier to encapsulate the device of a product is shown in FIG. 4. The product 400 comprises a substrate 410, a device 401 having a device footprint (which may comprise an active device area and an inactive device area) disposed on the substrate 410, and a plurality of inorganic layers 402 and polymer layers 403 disposed over the device 401. As shown, the device 400 uses an inorganic layer mask (used in depositing the inorganic layers 402) that is larger than the polymer layer mask (used in depositing the polymer layers 403) such that an inorganic layer 420 covers the side of the polymer layers 403. As shown in FIG. 4, even in this approach, the horizontal ingress path (i.e. Path-1 shown by the arrow 404) is the easiest path for water vapor to travel horizontally and reach the device 401 of the product 400. The barrier layer created by this method for the horizontal ingress path (i.e. Path-1 (404)) for the permeation of water vapor (or other permeants) for a 5-layer stack design is equivalent to a bi-layer barrier consisting of a first inorganic layer (typically 50 nm in thickness and disposed adjacent to the footprint of device 401), a second polymer layer (typically 800 nm in thickness), and a third inorganic layer (typically 200 nm in thickness labeled as 420 in FIG. 4). Therefore, as shown, the resistance to horizontal permeation that this type of multilayer barrier design provides is equivalent to a multilayer barrier consisting of two inorganic layers and a polymer layer disposed in-between (e.g. sandwiched between). Thus, while the vertical ingress comprises five inorganic barrier layers 402 and four polymeric layers 403, the horizontal ingress provides a much easier permeation path that may determine the lifetime or degradation of the device 401.

Figure 5:
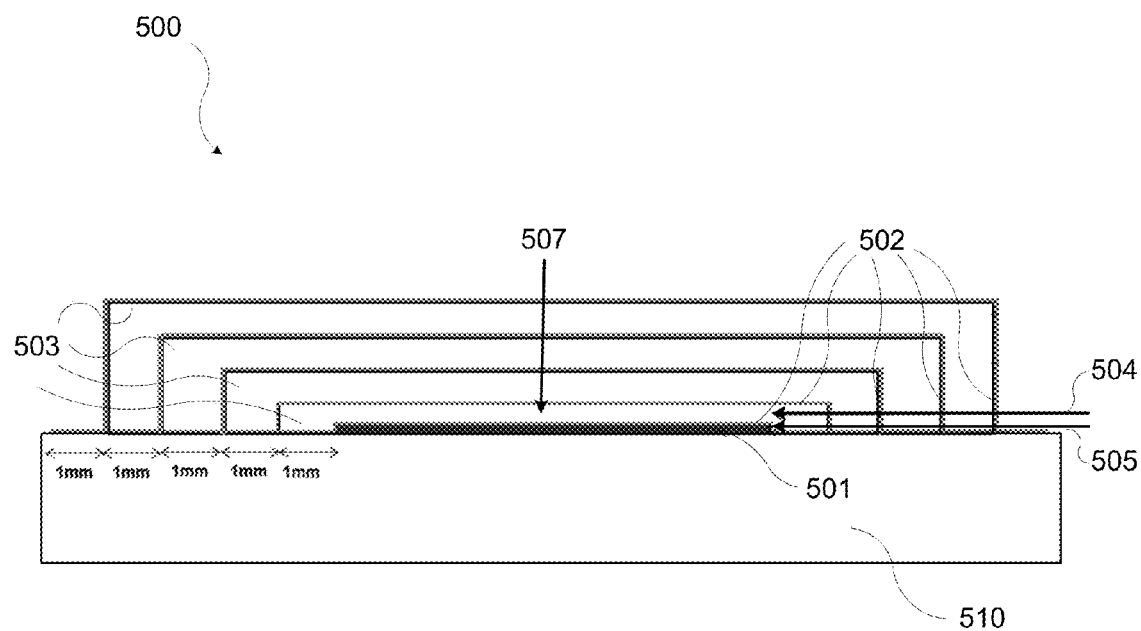
FIG. 5 shows a cross-section of an exemplary device having a multilayer barrier. The footprints of the masks used for each stack of inorganic and polymer film may be larger than the previous stack by, for example, 1 mm. The footprint of the first stack is larger than that of the device footprint of the device by, for example, 1 mm.

Yet another approach using a multilayer barrier design for a product is shown in FIG. 5. The product 500 comprises a substrate 510, a device 501 having a device footprint (which may comprise an active device area and an inactive device area) disposed over the substrate 510, and a plurality of inorganic 502 and polymer 503 layers disposed over and along the sides of the footprint of device 501. The barrier layers are deposited using increasingly larger sized masks for successive polymer 503 and inorganic layers 502. In this approach the water vapor traveling horizontally along Path-1 (shown by the arrow labeled 504) in the edge region of the product 500 faces the entire multilayer stack in its path before reaching the device 501 (unlike the products shown in FIGS. 3 and 4 described above). In this case, the edge seal provided by the multilayer barrier comprising layers 502 and 503 to the water vapor (or other permeant) traveling across the bulk of the barrier horizontally along Path-1 (504) is equivalent to the seal provided by the multilayer barrier to the water vapor traveling vertically across the bulk of the barrier (i.e. along Path-3 shown by the arrow 507).

However, even though the thickness of the polymer film per unit stack in the horizontal direction (typically ~1.0 mm each as shown in FIG. 5) is much greater than that of the thickness in the vertical direction (typically ~0.8 μm each), the resistance to water vapor diffusion across the layers is quite similar in both of the directions. The reason is that, as described by G. L. Graff, *Mechanisms of vapor permeation through multilayer barrier films: Lag time versus equilibrium permeation*, J. Appl. Phys., 96 (4), pp. 1840-1849 (2004), the effective thickness to calculate the length (l) in the lag time calculation ($t_l=l^2/(6D)$) is determined by either the thickness of the polymer film or the spacing of the defects in the inorganic film. In the vertical direction (i.e. along Path-3 (507)), the defect spacing of the inorganic film when assuming good permeation properties of the barrier layers (e.g. on the order of couple hundred microns) is much larger than the polymer film thickness. In the horizontal direction (i.e. along Path-1 (504)) the opposite is the case—that is, the defect spacing of the inorganic film is smaller than the polymer film thickness. Therefore, it is reasonable to assume that the edge ingress (e.g. Path-1 (504)) for the product 500 fabricated using a progressively increasing mask size approach is comparable to the vertical permeation (i.e. along Path-3 (507)) in the multilayer barrier.

Although two ingress paths were described above—i.e. horizontal Path-1 (504) and vertical Path-3 (507)—there is another potential ingress path for permeants (Path-2 shown by the arrow 505). Path-2 (505) corresponds to water vapor permeation along the interface of the inorganic film with the substrate 510. However, even if the interface permeation along Path-2 (505) for the inorganic film is worse than bulk permeation in the inorganic film, the length of the ingress path is rather large across the interface (e.g. approximately 5.0 mm as shown in FIG. 5), which is typically a large enough distance to make it a secondary ingress path in comparison to the ingress along Path-1 (504) (that is, permeants are more likely to reach the device 501 through Path-1 (504) before they reach the device 501 through Path-2 (505). One of the problems associated with the edge encapsulation approach shown in FIG. 5 of using progressively larger masks is the complexity associated with using the plurality of mask changes during fabrication—that is, each time a new mask is used during the fabrication process, it requires that the mask be properly aligned (adding to the time and expense of the process). In addition, the perpendicular length (e.g. footprint) of the barrier comprising the multiple inorganic 502 and polymer 503 layers is large (i.e. approximately 5.0 mm wider than that of the device 501 of the product 500 on each side). This may thereby increase the non-active edge area of the product around the footprint of device 501, which may, for instance, correspond to the border area of the device (i.e. non-emitting regions for an OLED), and also unnecessarily increases product size to accommodate the multiple barrier layers. Thus, the inventors have found that when attempting to reduce the edge ingress problem with an inorganic-polymer multilayer barrier, a long diffusion length may be needed so as to delay the water vapor (or other permeant) permeating in the horizontal direction (e.g. along Path-1 (504) or Path 2 (505)) along the edge of the product 500.

Thus, as described above, when attempting to use an inorganic-polymer multilayer barrier as an edge sealant, it is typically necessary to provide long diffusion lengths so as to delay the permeation of water vapor (or other particulate) across the barrier layers in the horizontal direction along the edge of the product (whether across the bulk of the material or along the interface). The techniques and configurations utilized in these multilayer barrier designs simply cannot delay this edge ingress of permeants (e.g. along the horizontal paths) unless these layers are several millimeters thick (i.e. extend away from the side of the device by several millimeters). However, using edge seals that are several millimeters thick creates a relatively large non-device edge area of the product (corresponding to the barrier layer that forms the edge seal around one or more sides of the device). This non-device edge area may then require that the overall size of the product (including the total size of the device footprint and the non-active device area) is substantially larger than the device itself, and may thereby create noticeable deficiencies in performance or appearance (e.g. by creating non-emitting area for light emitting devices). The inventors have discovered techniques and configurations for using a barrier film as an edge seal on devices that have components that may be susceptible to permeants (such as water vapor) that reduces or eliminates the non-device edge area of the product created by the edge seal (or at least minimizes the non-device edge area of the product when taking into consideration manufacturing and other errors such as cutting tolerances, etc.), while also providing sufficient protection for the device to reduce degradation and increase lifetime based on the ingress of permeants into the active device area of the device.

In this regard, and as shown and described with respect to FIGS. 7 and 8 below, the inventors have discovered that material that may form suitable barrier film layers may grow on vertical surfaces as well as horizontal surfaces. The ability to dispose barrier film material on vertical surfaces (such as the sides of the device and/or the substrate of a device) may enable the device (whether the active device area or the inactive device area of the device) to extend up to, and including, the edge of the substrate (thereby reducing or eliminating non-device edge area) because the barrier film need not necessarily be disposed over a surface of the substrate and along the side of the device (e.g. along the side or extending from the device footprint). Instead, in some embodiments, the barrier film may be disposed along a vertical side of the device and/or the substrate so as to create an edge seal that extends more or less in the vertical direction along the device and substrate (rather than horizontally away from the device).

Figure 6:
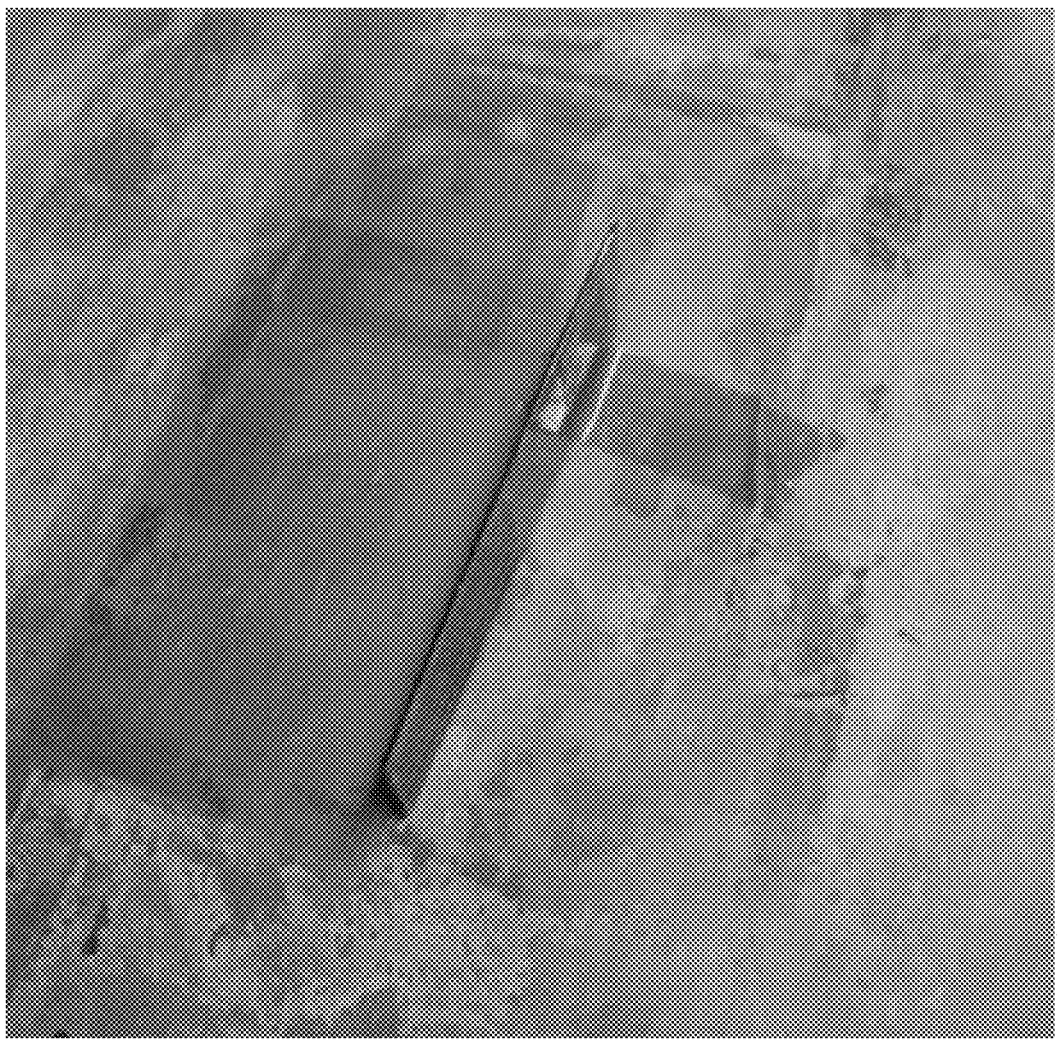
FIG. 6 is a photograph of a silicon wafer mounted vertically on a substrate electrode in a plasma enhanced vapor deposition (PECVD) system.

Provided below is a description of the experiments conducted by the inventors in determining the applicability of disposing barrier films along the vertical surface of a substrate and/or device (e.g. a side of the active device area or inactive device area). The inventors first mounted a piece of silicon wafer vertically on the substrate electrode in a plasma enhanced chemical vapor deposition (PE-CVD) system, as shown in the photograph of FIG. 6. The height of the silicon wafer in this experiment was approximately 1.0 cm. A barrier film was then grown by depositing a hybrid barrier film that comprised a mixture of a polymeric material and a non-polymeric material. Exemplary deposition methods, conditions, and materials for the barrier layer comprising a hybrid material are described below, as well as, for example, in U.S. Pat. No. 7,968,146, filed Oct. 31, 2007; U.S. patent application Ser. No. 11/783,361, filed Apr. 9, 2007; U.S. patent application Ser. No. 12/990,860, filed May 5, 2009, and U.S. Prov. App. No. 61/086,047, each of which is hereby incorporated by reference in its entirety for all purposes. It should be appreciated that any suitable material may be used for the barrier film in embodiments provided herein, and the barrier film may generally be deposited in any suitable manner so as to form an edge seal as described herein, unless otherwise specified, as would be understood by one of ordinary skill in the art after reading this disclosure.

The inventors also conducted an experiment to determine the extent to which the exemplary barrier films could be deposited indirectly over a surface (that is, a surface that was not substantially perpendicular or exposed to the deposition material) using existing deposition techniques and apparatuses. With reference to FIG. 7, an exemplary fabrication process and apparatus will be described that was used by the inventors in depositing the barrier film over a substrate. As was noted previously, any type of deposition process may be used in accordance with embodiments provided herein. In this exemplary case, the inventors used a PE-CVD apparatus and deposition technique. In general, a PE-CVD apparatus (such as apparatus 700 shown in FIG. 7) comprises a reaction chamber designed to contain a vacuum and a vacuum pump connected to the reaction chamber to create and/or maintain the appropriate pressure. An $N_2$ gas tank may be used to provide $N_2$ gas for purging the apparatus 700. For handling the flow of gases, the apparatus 700 may also include various flow control mechanisms (such as mass flow controllers, shut-off valves, and check valves), which may be under manual or automated control. A precursor material source(s) may be utilized to provide a precursor material (e.g. HMDSO in liquid form or one or more of the materials described in more detail below), which is vaporized and fed into the reaction chamber. In some cases, the precursor material may be transported to the reaction chamber using a carrier gas, such as argon. A reactant gas tank provides the reactant gas (e.g. oxygen), which is also fed into the reaction chamber (e.g. via gas feed 705). The precursor material and reactant gas flow into the reaction chamber to create a reaction mixture. The pressure inside the reaction chamber may be adjusted further to achieve the deposition pressure.

The reaction chamber includes a substrate electrode 701 and a bottom electrode 704 mounted on electrode standoffs, which may be conductors or insulators. The electrode mesh 703 is disposed between the substrate electrode 701 and the bottom electrode 704 and is supplied with RF power to create plasma conditions in the reaction mixture. Reaction products created by the plasma are deposited onto the substrates 702.

The bottom electrode 704 is also shown as having a gas feed through 705 where gas may enter the reaction chamber. The reaction is allowed to proceed for a period of time sufficient to deposit a barrier film layer (e.g. a hybrid layer of material such as those described below or any other suitable layer of material) on a substrate. In general, the reaction time will depend upon various factors, such as the position of the substrate with respect to the electrodes, the type of material (e.g. barrier film material) to be deposited, the reaction conditions, the desired thickness of the barrier film layer, the precursor material, and the reactant gas. A person of ordinary skill in the art would understand that these conditions may be varied and/or tuned to achieve a deposited film layer having desired properties depending on the particular application. The reaction time is typically between 5 seconds and 5 hours, but longer or shorter times may also be used depending upon the application.

Figure 7:
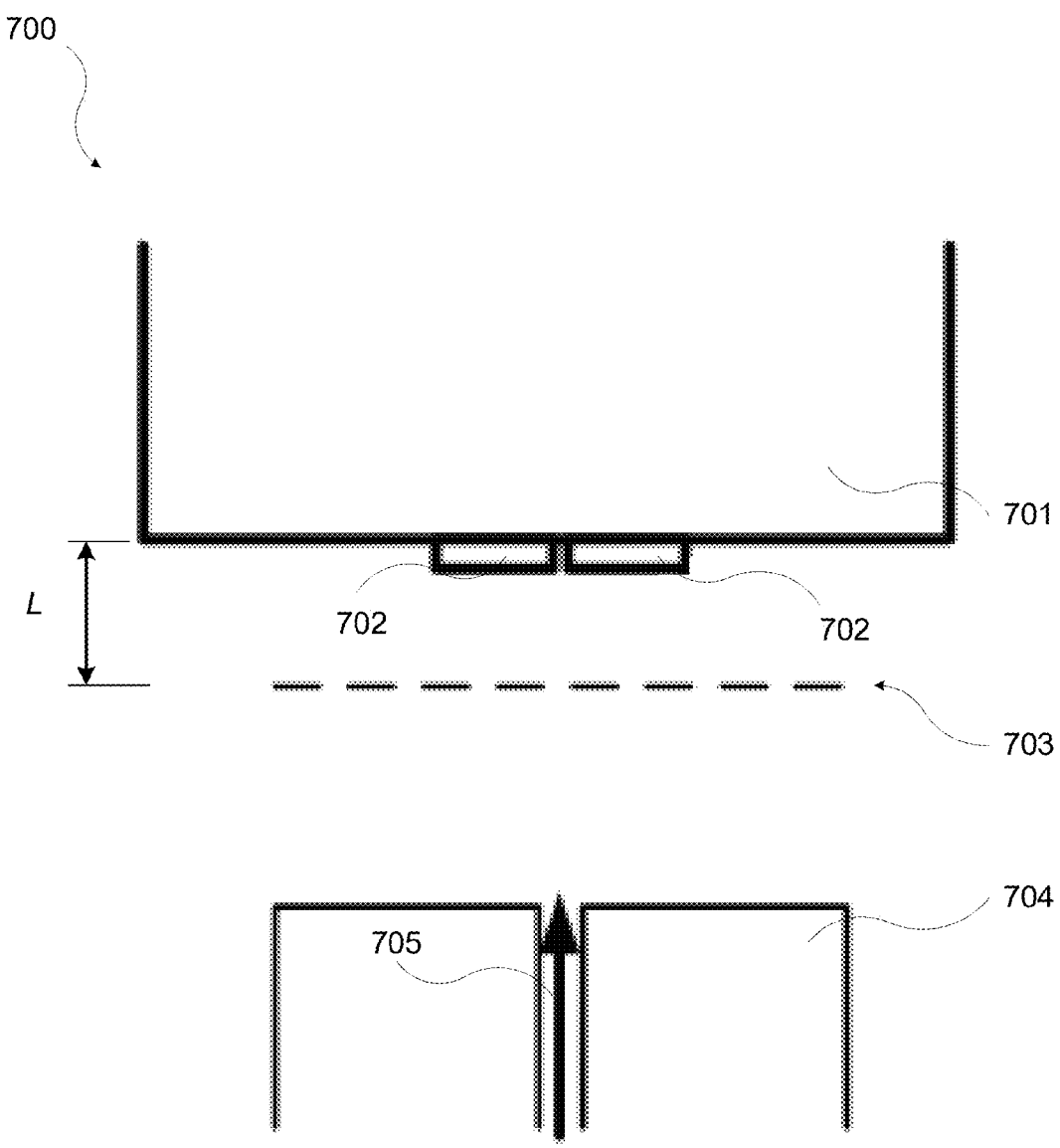
FIG. 7 is a cross sectional view of an exemplary plasma enhanced chemical vapor deposition apparatus in accordance with some embodiments.
Figure 8:
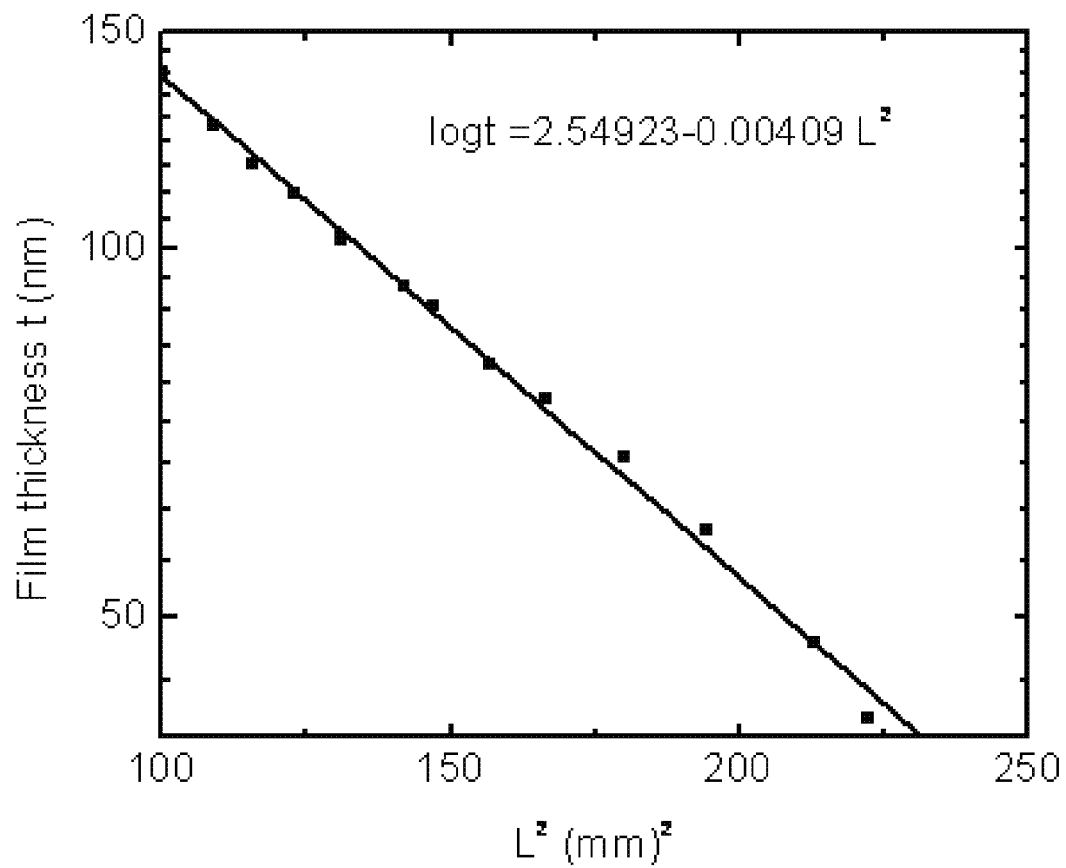
FIG. 8 is an exemplary plot of experimental results correlating semi-logarithmic scale of film thickness (log(t)) vs. length, where the "length" corresponds to the distance from an RF electrode to a substrate in an exemplary vapor deposition process.

As shown in FIG. 7, there is a distance ("L") between the deposition location on the sample substrates 702 and the RF powered mesh electrode 703 in this exemplary PE-CVD apparatus 700. As this distance L is increased, fewer radicals reach the substrates 702 and therefore the deposition rate decreases (i.e. the rate of growth of the deposited material on the substrates 702 decreases). After performing the PE-CVD process, the distance L for each location of the substrate was determined as well as the thickness of the deposited layer at that location. The exemplary deposition process utilized a precursor material comprising HMDSO and oxygen as a reactant gas. The conditions for the exemplary deposition process are detailed in table 1 below. Throughout the deposition process the positions of the electrodes and the substrate were kept constant. The results of these tests are illustrated in the plot in FIG. 8, which shows that the semi-logarithmic scale of film thickness (log(t)) is dependent on the square of distance L. For this example, as shown FIG. 8 the log(t) decreases linearly with $L^2$, having a negative slope of 0.00409. Therefore, based on these results, the inventors determined that the barrier film can be disposed on (e.g. grow on) surfaces that are not disposed such that the surface is directly exposed to the plasma (i.e. the surfaces that do not directly see or are not perpendicular to, the plasma). Therefore, the inventors found that the device (e.g. the active device area and/or inactive device area of the device) could be sufficiently encapsulated even when the device extends at or near the edge of the substrate by providing a portion of the layer on the vertical surfaces of the device and/or the substrate.

TABLE 1

Process conditions for film deposition on the Si wafer in FIG. 6.

| Oxygen (sccm) | HMDSO (sccm) | Power density (mW/cm$^2$) | Pressure (mTorr) |
|---|---|---|---|
| 33 | 1.25 | 384 | 120 |

Figure 9:
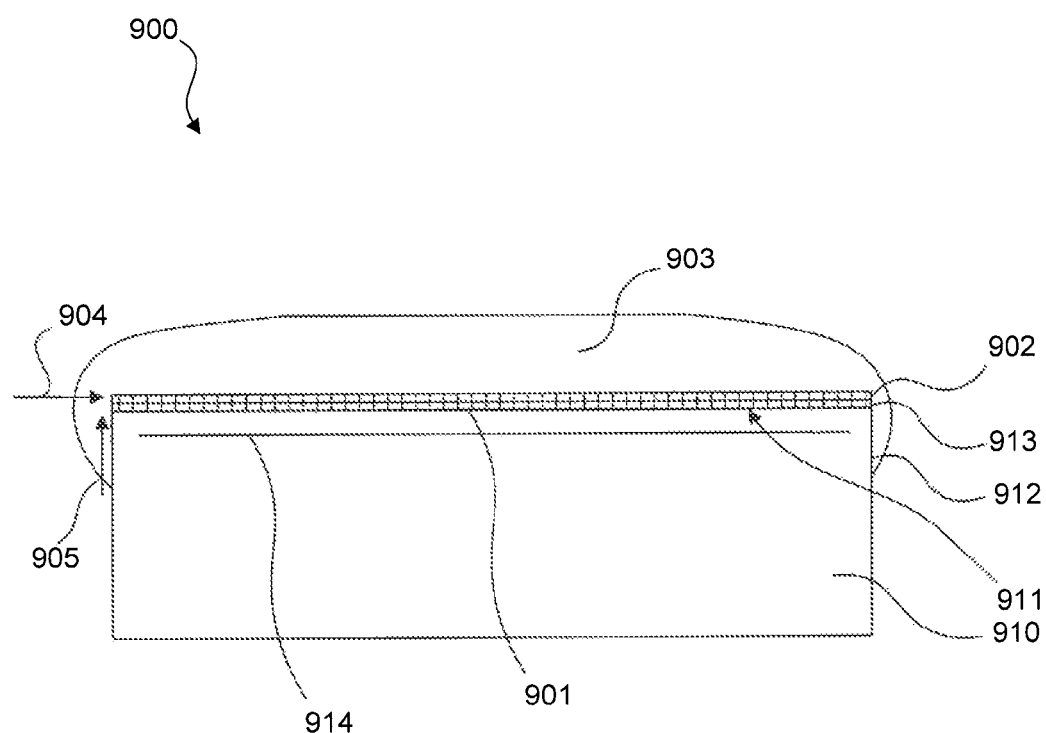
FIG. 9 is a cross sectional view of an exemplary device in accordance with some embodiments.

FIG. 9 shows the cross-section of an exemplary product 900 in which the device 901 is disposed up to the edge of the substrate 910. As shown, the exemplary product comprises a substrate 910 having a first surface 911, a first side 912, and a first edge 913 where the first surface 911 meets the first side 912; a device 901 that is disposed on the first surface 911 of the substrate 910 and having a side 902; and a barrier film 903. As shown, the device 901 extends up to the first edge 913 of the substrate 910 such that the side 902 of the device 901 is disposed over the first edge 913 of the substrate 910 (or is within a small distance—e.g. less than 3.0 mm—from the edge 913). The barrier film 903 in the exemplary device 900 is shown as covering (e.g. being disposed over) the first edge 913 of the substrate 910, a portion of the first vertical side 912 of the substrate 910, and the side 902 of the device 901 that is disposed over the edge 913 of the substrate 910 (or within a small distance of the edge 913). Such an encapsulation (or edge seal in some instances) of the device 901 of the product 900 may be accomplished by depositing (e.g. growing) the device 901 on the substrate 910 first, then cutting the substrate 910 and/or the device 901, then depositing the barrier film 903 so as to encapsulate the device 901 by mounting the product 900 in the deposition chamber such that the edges of the substrate 910 are not (as much as possible) covered with any type of mask, thereby allowing the barrier film to be deposited (and thereby grow) on the vertical side and edges of the substrate 910 and/or the vertical side(s) of the device 901 during barrier film deposition.

In this exemplary embodiment, the water vapor (or other permeant) travelling horizontally along Path-1 (shown by the arrow labeled 904) in the edge region of the product 900 permeates through the bulk of the barrier film 903 material to reach the device 901. Therefore, if the barrier film 903 comprises a material that has a sufficient diffusion coefficient, the perpendicular length (or thickness) of the barrier film 903 extending away from the side of the device 901 in this location may be relatively small (e.g. less than 3.0 mm; preferably less than 1.0 mm; and more preferably less than 0.1 mm). The inventors have found that for some materials (such as some of the hybrid layers comprising a mixture of polymeric and non-polymeric material described herein), the perpendicular length of the barrier film 903 may be less than 0.1 mm and still provide a sufficient edge seal for adequate device lifetime. As described above, providing a barrier film 903 with a short perpendicular length may allow for the side (e.g. side 902) of the device 901 to be disposed within a corresponding distance (e.g. in this example within 0.1 mm) of the edge 913 of the substrate 910. Moreover, the ingress along Path-2 (shown by the arrow labeled 905) corresponding to the diffusion across the interface between the barrier film 903 and the substrate 910 in the edge region of the product 900 can be extended along the vertical side of the substrate 910. In this manner, Path-2 (905) (which typically has a higher diffusion coefficient than the bulk diffusion coefficient of the barrier film 903) may be lengthened without increasing the perpendicular length of the barrier film 903 extending away from the side of the device 901. That is, by disposing the barrier film 903 further down the vertical side of the substrate 910 (e.g. covering more of the side 912 of the substrate 910), the length of the ingress Path-2 (905) may be extended by a corresponding distance. Increasing the length of the ingress path may increase the permeation time and thereby the lifetime of the device (at least with regard to environmental degradation). Thus, unlike embodiments where the barrier film 903 is disposed over the first surface 911 of the substrate 910, in this example Path-2 (905) may be lengthened without having to potentially increase the non-device edge area of the product (which results when the perpendicular length of the barrier film 903 extending away from the side of the device 901 is increased). The barrier film 903 may extend along the side 912 of the substrate 910 to any suitable distance. The inventors have found that in some embodiments, it may be preferred that the barrier film 903 comprising a mixture of a polymeric and non-polymeric material may extend at least 0.1 mm along the side 912 of the substrate 910 (preferably at least 1.0 mm and more preferably at least 3.0 mm).

In general, some embodiments provided herein may enable electronic devices to reduce or eliminate the non-device edge area. That is, embodiments may enable at least a portion of the perimeter of the device (i.e. an edge of the device) to overlap with an edge of the substrate it is disposed over (or be disposed within a small distance of the edge). In some embodiments, this may be enabled by depositing the barrier film on both the top and the side of the device (e.g. over an organic layer of an OLED) and also extending the barrier film to cover a portion of a side of the substrate. It should be noted that the barrier film may have a certain thickness along the side of the substrate (i.e. the barrier film may extend down the side of the substrate in a direction away from the surface on which the device is disposed over a certain distance). There may also be additional materials disposed over the top of the barrier film and/or over the portion of the barrier film covering the edge of the substrate in some embodiments.

In addition to some of the advantages noted above, another advantage may be provided by some embodiments based on disposing the barrier film over the vertical side of the substrate. This vertical surface may not have been exposed to any coating or surface treatment during any of the other deposition process step (e.g. when depositing the device or other components, materials may not have also be deposited onto the side of the substrate) and therefore the barrier film may form a very dense, high-quality interface with the surface of the vertical side of the substrate. This dense, high-quality interface may thereby decrease permeation across the interface between the barrier film and the substrate, effectively increasing the lifetime of the device and/or reducing degradation of the device (or enabling the barrier film to extend a shorter distance along the side of the side of the substrate).

Embodiments provided herein may in general use any suitable substrate, such as glass or flexible substrates such as metal foils and plastics. It is generally preferred that the vertical sides of the device and (at least a portion of) the substrate have good coverage by the barrier film. Certain processes may used to fabricate such devices that will promote such behavior of the barrier film, some of which are provided below.

In some embodiments, the top side of the device may be further protected by placing/laminating a layer of materials that have good barrier property. These materials may include, by way of example only, glass, metal foil, and/or barrier coated plastic (i.e. a plastic material coated with a barrier film on one or more surfaces—such as a hybrid layer comprising a mixture of polymeric and non-polymeric material). This approach may be particularly preferred when particles/contaminants are present on the top surface of the device.

In some embodiments, additional protection may be provided along a side of the substrate. For example, the side of an OLED device may be protected from moisture and oxygen by the barrier film encapsulation around the side of the device, which extends along a portion of a side of the substrate. A second barrier film layer or other encapsulation could also be applied to the side of the substrate to further enhance the permeation property of the device. Furthermore, as was noted above, other coatings and materials may be applied to the top of the barrier film encapsulation and/or sides of the barrier film at the substrate to provide functions such as mechanical protection, special texture for holding (e.g. coupling) components to the device or substrate, or other active functions (e.g. sensing). In some embodiments, it may be preferred that these extra materials also have good permeation properties as well.

Embodiments provided herein that may comprise a thin film encapsulated device may provide the advantage of having no non-device edge areas (or a limited/reduced amount of non-device edge area) on not only three sides of the device (as shown in the experimental device fabricated by the inventors described below), but such devices could also have no (or a limited amount of) non-device edge areas on all four sides (or more) around the device. In some such embodiments, the electrical contact points may be moved toward the center of the device (i.e. into the active device area) rather than being disposed on an edge. This would, for instance, allow devices such as lighting panels or displays to be easily tiled because there may not be a noticeable non-active (i.e. non-emitting) area between the active device areas of each device. However, as described in more detail below, embodiments are not so limited and the electrical contacts could be disposed along one or more sides of the substrate. A further advantage of some of the embodiments provided herein is that a repeatable bus line design could be used on a large size substrate such that the device (e.g. a lighting panel) could be cut so as to include a single pattern or multiple repeats of the pattern depending on the device size that was desired. Another potential advantage, particularly for products that comprise an OLED panel, is that such products may enable electronic gadgets (such as a smart phone, tablet or notebook computer, TV, etc.) to have no (or a minimum) non-emitting areas at the gadget level. In electronic gadgets that comprise a limited non-device edge area, the edge (and/or sides) of the device may be exposed (but protected by a barrier film). However, as mentioned above, embodiments provided herein are not limited to organic devices such as OLEDs, but could comprise any device or component that comprises a thin film barrier layer. Some other electronic devices include solar cells, thin film batteries, and organic electronics.

Figure 12A:
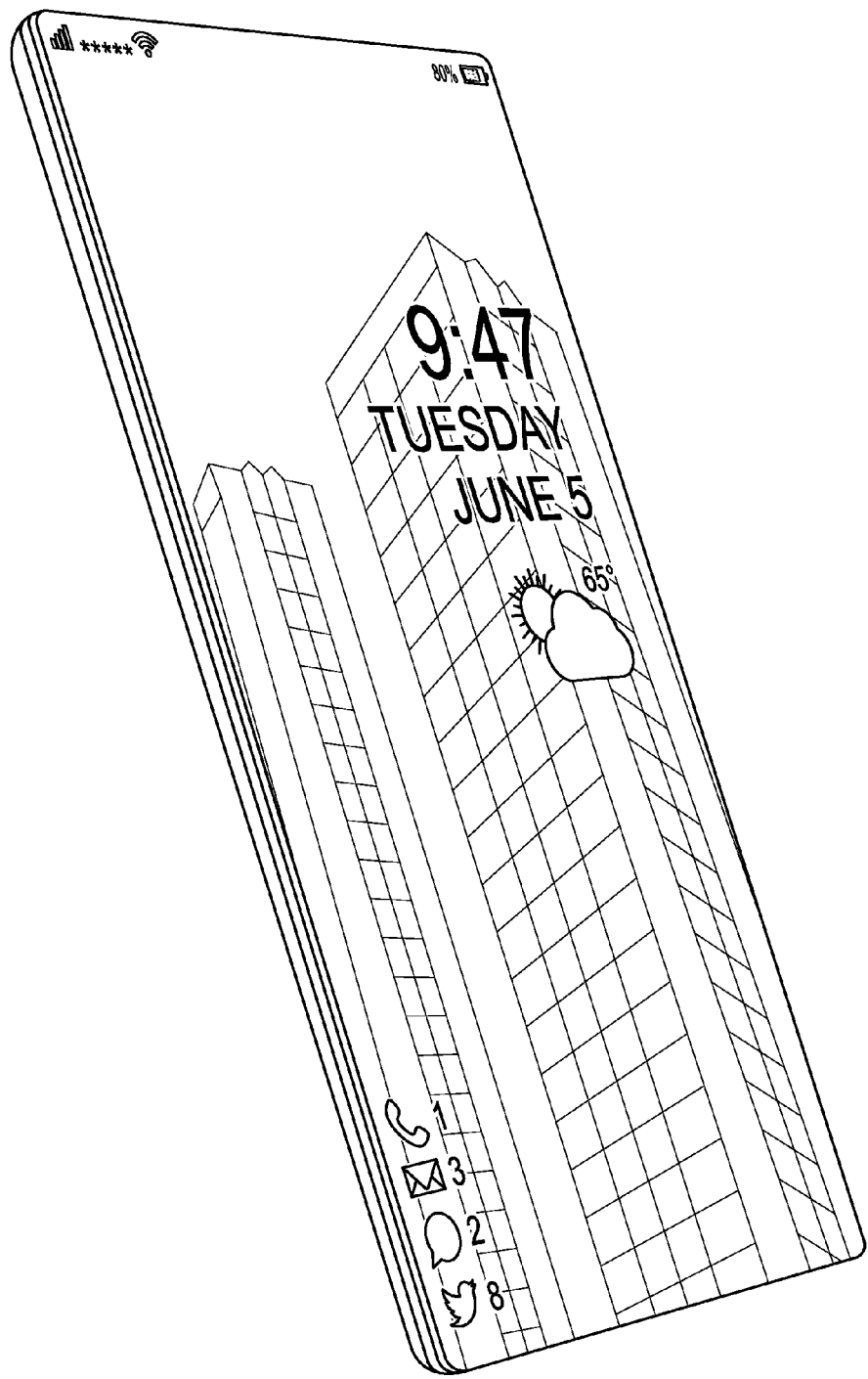
FIGS. 12(a) and (b) show an exemplary mobile device in accordance with some embodiments.
Figure 12B:
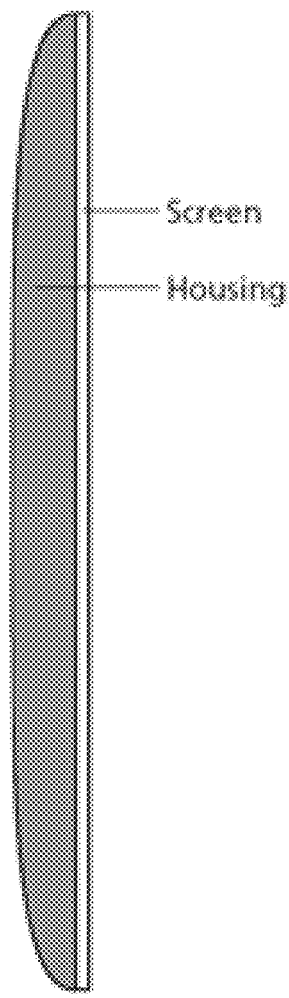

As noted above, embodiments provided herein may comprise many types of consumer electronics devices (or components thereof). The products that comprise a limited amount (or no) non-device edge areas around the device, such as the examples described herein, may enable the implementation of consumer electronics devices having no frame (at the electronics device level) at least around part of the device perimeter. An example is illustrated in FIG. 12(*a*), which shows an exemplary Smartphone design that has a display that extends to the edge of the product (without a non-device edge area disposed around any of the sides of the display). In this design, all four edges of the phone have no frame or non-device edge area. This design is provided by having the housing foot-print no larger than the display panel footprint, as illustrated in FIG. 12(*b*). In other design embodiments, not all four sides of the consumer electronics devices may comprise a side of the device (i.e. there may be one or more sides that have a non-device edge area and/or a frame extending outside of the footprint of the display).

In some embodiments, a method for fabricating a product such as the exemplary embodiment shown in FIG. 9 may comprise the following process sequence: 1) scribing the back surface of substrate (i.e. the surface of the substrate on which the device is not disposed on); 2) disposing (e.g. growing) the device on the front surface of the substrate (e.g. the surface opposite the back surface); 3) breaking the substrate at the pre-scribed places to expose the vertical sides of the device and substrate; and 4) applying a barrier film encapsulation to cover both the side of the device (and the top in some embodiments) and the edge and at least a portion of a vertical side of the substrate.

The process described above is provided as one example of how such an exemplary device may be fabricated. However, as noted above, embodiments comprising a barrier film that covers a portion of the edge and side of the substrate (as well as a side of the device) may be fabricated using any suitable method as may be understood by one of ordinary skill in the art after reading this disclosure. For example, the inventors have discovered that some embodiments may comprise any of the following: Rather than scribing and/or cutting the substrate and/or device, a small substrate may be used (i.e. a substrate with a small surface for the device to be disposed on). The footprint of the device may be larger than the surface of the substrate resulting in a device that extends to the edge of the substrate. Both the substrate and the device may have vertical sides exposed that may be covered when the barrier film is the deposited.

Another exemplary method of fabricating a product may be to dispose the device (e.g. grow the layer(s) of the device) without pre-scribing the substrates. After the device (such as an organic layer of an OLED) is deposited, the side of the device and at least a portion of a side of the substrate may be exposed by anyone of: scribing into the substrate; laser ablating the device and the substrate, or any other suitable method. The barrier film may then be deposited so as to cover the side of the device and at least a portion of the edge and exposed side of the substrate. In some embodiments, such as when flexible substrates such as metal foils or plastics are used, a simple method of exposing a side of the substrate and/or device side is to use scissor cutting (or any other cutting technique). The barrier film may then be deposited so as to cover the side of the device and at least a portion of the edge and exposed side of the substrate.

Electrical Connections

As described above, embodiments provided herein using thin film encapsulation may provide the ability to make products (such as those comprising an OLED display) with the device(s) very close to the edge of the substrate. This may provide, for example, truly borderless (or near borderless) displays, either for viewing as a single display, or when tiling multiple devices to make a larger display system. Although the examples provided below will be described with reference to a display, embodiments providing electrical contacts to the device(s) disposed on the substrate may be equally applicable to other types of devices, such as the types of devices provided as examples herein (e.g. solar cells, thin film batteries, organic electronic devices, etc).

One potential issue for such borderless devices (i.e. devices with no, or reduced, non-device edge area around one or more sides of the device) such as displays is how to provide the necessary electrical drive to the devices (particularly for displays that utilize both row and column signals). In a conventional display, these signals may be applied to the display by connections close to the display edge, with or without integrated functionality to multiplex these signals, provide scan drivers, etc., through the use of thin film transistors (TFTs) fabricated on the substrate or through integrated circuits bonded to the substrate near the display edge.

Provided below are two exemplary methods of providing electronic connections for a truly borderless (or near borderless) display. In each of these examples, the general concept is to connect the row and column electrodes on the front of the display with electrical connections on the back of the display, so that connectors and drive circuitry (e.g. portions of the electronic package of the device) may be applied to the back surface of the display. In this manner, these components will be disposed within the area (i.e. footprint) of the substrate and/or device, and will not require or create a non-device edge areas or a border/frame around the device. In general, the exemplary methods provided below would preferably be performed prior to backplane fabrication and frontplane fabrication, although embodiments may not be so limited.

Figure 10:
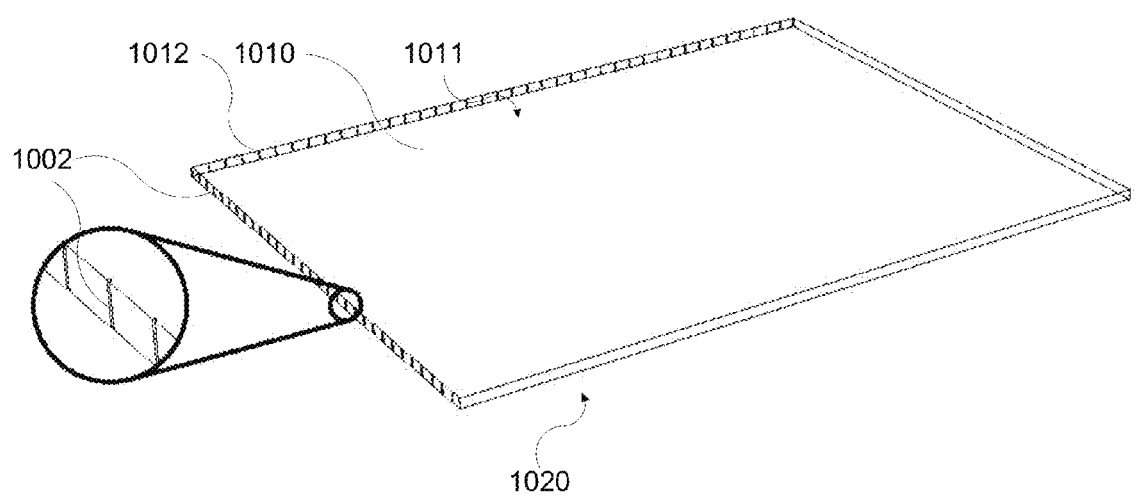
FIG. 10 is an illustration of an exemplary configuration of electrical conductors from a first surface of a substrate to a second surface of the substrate in accordance with some embodiments.

The first exemplary embodiment comprises the use of vias fabricated into the substrate from the front to the back surface of the substrate. This is illustrated in FIG. 10, which shows a substrate 1010 having a front (or top) surface 1011 and a back (or bottom) surface 1020, and that comprises a plurality of micro-holes 1002 drilled through the glass (or other suitable substrate material) substrate 1010. These vias (e.g. micro-holes 1002) can be filled with conductive material (such as metal) to provide electrical connectivity between row or column lines on the display front surface 1011 with electrical connections on the back surface 1020 of the display. The micro-holes 1002 could be near the display edge 1012 (as shown) or disposed anywhere else on the display.

Figure 11:
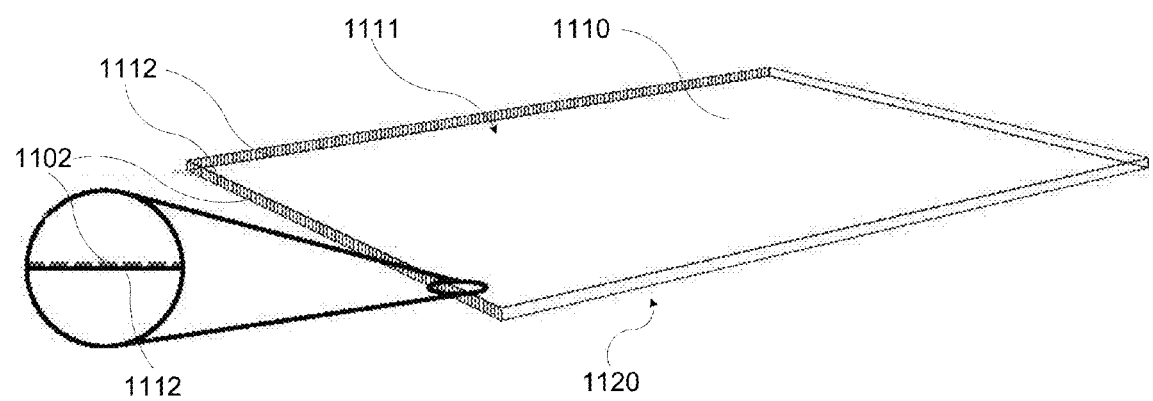
FIG. 11 is an illustration of an exemplary configuration of electrical conductors from a first surface of a substrate to a second surface of the substrate in accordance with some embodiments.

The second exemplary embodiment comprises patterning conductors disposed on the side(s) of a display to connect the row and column lines on the display front surface with electrical connections on the back surface. This is illustrated in FIG. 11, which shows a substrate 1110 having a front (or top) surface 1111 and a back (or bottom) surface 1120, and that comprises a plurality of patterned conductors 1102 along the sides 1112 of the substrate 1110. The pattered conductors 1102 may comprise conductive traces along the substrate sides 1112 and/or top surface 1111 of the substrate 1102 that may connect one or more bus lines on the front 1111 of the display with electrical connections on the back 1120. The patterned conductors 1102 may be formed using any suitable method, such as direct printing (e.g. ink jet printing of thin electrical lines from soluble conductive inks); depositing and patterning using vacuum deposition process with shadow mask; depositing metals or conductive inks on the display side(s) 1112 and then patterning using lithography or using a laser to ablate films from regions to remove conductive material and to leave conductive traces or leads, where the deposition process can include depositing metals or conductors by vacuum processes (e.g. sputtering, evaporation, etc.); or by dipping the display side(s) 1112 into a soluble conductive ink.

In either case, the exemplary approaches may allow for the application of a barrier film to encapsulate and form hermetic seals around a device, including any or all patterned conductors. As noted above, although the exemplary approaches were described with respect to a display device, embodiments are not so limited. The same or similar methods could be applied to a lighting panel or any other device that utilizes a barrier film as an edge or encapsulation layer. For most devices, particularly light panels, the number of patterned conductors is typically much less than the number required for a display and therefore the methods may be more readily implemented.

Composition and Fabrication of Exemplary Barrier Film

Provided below are exemplary compositions (and methods of fabricating such compositions) of barrier film molecules and materials that may be used as an edge sealant in some embodiments as described above. In this regard, exemplary embodiments of materials (and deposition processes) that may be used as an edge sealant are described in detail in U.S. Pat. No. 7,968,146 entitled "Hybrid Layers for Use in Coatings on Electronic Devices or Other Articles," which is hereby incorporated by references in its entirety for all purposes. The inventors have found that the materials and methods described in U.S. Pat. No. 7,968,146, some of which are provided below, may provide a barrier film that may be preferred for use as an edge sealant for electronic devices. However, embodiments are not necessarily limited to the molecules and methods described therein.

In this regard, and as was noted above, in some embodiments, the barrier film may comprise a hybrid layer comprising a mixture of a polymeric material and a non-polymeric material. The hybrid layer may have a single phase or multiple phases.

As used herein, the term "non-polymeric" may refer to a material made of molecules having a well-defined chemical formula with a single, well-defined molecular weight. A "nonpolymeric" molecule may have a significantly large molecular weight. In some circumstances, a non-polymeric molecule may include repeat units. As used herein, the term "polymeric" may refer to a material made of molecules that have repeating subunits that are covalently linked, and that has a molecular weight that may vary from molecule to molecule because the polymerizing reaction may result in different numbers of repeat units for each molecule. Polymers may include, but are not limited to, homopolymers and copolymers such as block, graft, random, or alternating copolymers, as well as blends and modifications thereof. Polymers include, but are not limited to, polymers of carbon or silicon.

As used herein, a "mixture of a polymeric material and a non-polymeric material" may refer to a composition that one of ordinary skill in the art would understand to be neither purely polymeric nor purely non-polymeric. The term "mixture" is intended to exclude any polymeric materials that contain incidental amounts of non-polymeric material (that may, for example, be present in the interstices of polymeric materials as a matter of course), but one of ordinary skill in the art would nevertheless consider to be purely polymeric. Likewise, this is intended to exclude any non-polymeric materials that contain incidental amounts of polymeric material, but one of ordinary skill in the art would nevertheless consider to be purely non-polymeric. In some cases, the weight ratio of polymeric to non-polymeric material in the hybrid layer is in the range of 95:5 to 5:95, and preferably in the range of 90:10 to 10:90, and more preferably, in the range of 25:75 to 10:90.

The polymeric/non-polymeric composition of a layer may be determined using various techniques, including wetting contact angles of water droplets, IR absorption, hardness, and flexibility. In certain instances, the hybrid layer has a wetting contact angle in the range 30° to 85°, and preferably, in the range of 30° to 60°, and more preferably, in the range of 36° to 60°. Note that the wetting contact angle is a measure of composition if determined on the surface of an as-deposited film. Because the wetting contact angle can vary greatly by post-deposition treatments, measurements taken after such treatments may not accurately reflect the layer's composition. It is believed that these wetting contact angles are applicable to a wide range of layers formed from organo-silicon precursors. In certain instances, the hybrid layer has a nano-indentation hardness in the range 3 to 20 GPa, and preferably, in the range of 10 to 18 GPa. In certain instances, the hybrid layer has a surface roughness (root-mean-square) in the range of 0.1 nm to 10 nm, and preferably, in the range of 0.2 nm to 0.35 nm. In certain instances, the hybrid layer, when deposited as a 4 mm thick layer on a 50 mm thick polyimide foil substrate, is sufficiently flexible that no microstructural changes are observed after at least 55,000 rolling cycles on a 1 inch diameter roll at a tensile strain (e) of 0.2%. In certain instances, the hybrid layer is sufficiently flexible that no cracks appear under a tensile strain (e) of at least 0.35% (typically a tensile strain level which would normally crack a 4 mm pure silicon oxide layer, as considered by a person of ordinary skill in the art).

It should be noted that the term "mixture" is intended to include compositions having a single phase as well as compositions having multiple phases. Therefore, a "mixture" excludes subsequently deposited alternating polymeric and non-polymeric layers. Put another way, to be considered a "mixture," a layer should be deposited under the same reaction conditions and/or at the same time.

The hybrid layer may be formed by chemical vapor deposition using a single precursor material (e.g. from a single source or multiple sources). As used herein, a "single source of precursor material" may refer to a source that provides all the precursor materials that are necessary to form both the polymeric and non-polymeric materials when the precursor material is deposited by CVD, with or without a reactant gas. This is intended to exclude methods where the polymeric material is formed using one precursor material, and the non-polymeric material is formed using a different precursor material. As would be appreciated by one of skill in the art, a "single source" of precursor material may include one or more containers (e.g. crucibles) that may be used during the process to heat or mix the chemicals that may form or contain a single precursor material. For instance, a single precursor material may be mixed or located in a plurality of containers and then vapor deposited. In general, by using a single precursor material, the deposition process may be simplified. For example, a single precursor material will obviate the need for separate streams of precursor materials and the attendant need to supply and control the separate streams.

In general, the precursor material may be a single compound or a mixture of compounds. Where the precursor material is a mixture of compounds, in some cases, each of the different compounds in the mixture is, by itself, able to independently serve as a precursor material. For example, the precursor material may be a mixture of hexamethyl disiloxane (HMDSO) and dimethyl siloxane (DMSO). Other precursors may also be utilized such as tetraethoxysilane (TEOS) or dimethyl siloxane (DMSO) or octamethylcyclotetrasiloxane orhexamethyldisilazane or other organosilanes or organosiloxanes and organosilazanes or their mixtures.

In some cases, plasma-enhanced CVD (PE-CVD) may be used for deposition of the hybrid layer. PE-CVD may be desirable for various reasons, including low temperature deposition, uniform coating formation, and controllable process parameters. Various PE-CVD processes that are suitable for use in forming a hybrid layer that may comprise a barrier layer for an edge sealant are known in the art, including those that use RF energy to generate the plasma.

The precursor material may be a material that is capable of forming both a polymeric material and a non-polymeric material when deposited by chemical vapor deposition. Various such precursor materials are suitable for use in providing a barrier film comprising a hybrid layer and may be chosen for their various characteristics. For example, a precursor material may be chosen for its content of chemical elements, its stoichiometric ratios of the chemical elements, and/or the polymeric and non-polymeric materials that are formed under CVD. For instance, organo-silicon compounds, such as siloxanes, are a class of compounds suitable for use as the precursor material. Representative examples of siloxane compounds include hexamethyl disiloxane (HMDSO) and dimethyl siloxane (DMSO). When deposited by CVD, these siloxane compounds are able to form polymeric materials, such as silicone polymers, and non-polymeric materials, such as silicon oxide. The precursor material may also be chosen for various other characteristics such as cost, non-toxicity, handling characteristics, ability to maintain liquid phase at room temperature, volatility, molecular weight, etc.

Other organo-silicon compounds suitable for use as a precursor material include methylsilane; dimethylsilane; vinyl trimethylsilane; trimethylsilane; tetramethylsilane; ethylsilane; disilanomethane; bis(methylsilano)methane; 1,2-disilanoethane; 1,2-bis(methylsilano)ethane; 2,2-disilanopropane; 1,3,5-trisilano-2,4,6-trimethylene, and fluorinated derivatives of these compounds. Phenyl-containing organo-silicon compounds suitable for use as a precursor material include: dimethylphenylsilane and diphenylmethylsilane. Oxygen containing organo-silicon compounds suitable for use as a precursor material include: dimethyldimethoxysilane; 1,3,5,7-tetramethylcyclotetrasiloxane; 1,3-dimethyldisiloxane; 1,1,3,3-tetramethyldisiloxane; 1,3-bis(silanomethylene)disiloxane; bis(1-methyldisiloxanyl)methane; 2,2-bis(1-methyldisiloxanyl) propane; 2,4,6,8-tetramethylcyclotetrasiloxane; octamethylcyclotetrasiloxane; 2,4,6,8,10-pentamethylcyclopentasiloxane; 1,3,5,7-tetrasilano-2,6-dioxy-4,8-dimethylene; hexamethylcyclotrisiloxane; 1,3,5,7,9-pentamethylcyclopentasiloxane; hexamethoxydisiloxane, and fluorinated derivatives of these compounds. Nitrogen-containing organosilicon compounds suitable for use as a precursor material include: hexamethyldisilazane; divinyltetramethyldisilizane; hexamethylcyclotrisilazane; dimethylbis(N-methylacetamido) silane; dimethylbis-(N-ethylacetamido)silane; methylvinylbis(N-methylacetamido)silane; methylvinylbis (Nbutylacetamido)silane; methyltris(N-phenylacetamido) silane; vinyltris(N-ethylacetamido)silane; tetrakis (Nmethylacetamido)silane; diphenylbis(diethylaminoxy) silane; methyltris(diethylaminoxy)silane; and bis(trimethylsilyl)carbodiimide.

When deposited by CVD, the precursor material may form various types of polymeric materials in various amounts, depending upon the type of precursor material, the presence of any reactant gases, and other reaction conditions. The polymeric material may be inorganic or organic. For example, where organo-silicon compounds are used as the precursor material, the deposited hybrid layer may include polymer chains of Si—O bonds, Si—C bonds, or Si—O—C bonds to form polysiloxanes, polycarbosilanes, and polysilanes, as well as organic polymers.

When deposited by CVD, the precursor material may form various types of non-polymeric materials in various amounts, depending upon the type of precursor material, the presence of any reactant gases, and other reaction conditions. The non-polymeric material may be inorganic or organic. For example, where organo-silicon compounds are used as the precursor material in combination with an oxygen-containing reactant gas, the non-polymeric material may include silicon oxides, such as SiO, Si0$_2$, and mixed-valence oxides SiO$_x$. When deposited with a nitrogen-containing reactant gas, the non-polymeric material may include silicon nitrides (SiN$_x$). Other non-polymeric materials that may be formed in some instances include silicon oxycarbide and silicon oxynitrides.

When using PE-CVD, the precursor material may be used in conjunction with a reactant gas that reacts with the precursor material in the PE-CVD process. The use of reactant gases in PE-CVD is known in the art and various reactant gases are suitable for use in the present invention, including oxygen containing gases (e.g., 0$_2$, ozone, water) and nitrogen-containing gases (e.g., ammonia). The reactant gas may be used to vary the stoichiometric ratios of the chemical elements present in the reaction mixture. For example, when a siloxane precursor material is used with an oxygen or nitrogen-containing reactant gas, the reactant gas will change the stoichiometric ratios of oxygen or nitrogen in relation to silicon and carbon in the reaction mixture. This stoichiometric relation between the various chemical elements (e.g., silicon, carbon, oxygen, nitrogen) in the reaction mixture may be varied in several ways. One way is to vary the concentration of the precursor material or the reactant gas in the reaction. Another way is to vary the flow rates of the precursor material or the reactant gas into the reaction. Another way is to vary the type of precursor material or reactant gas used in the reaction.

Changing the stoichiometric ratios of the elements in the reaction mixture can affect the properties and relative amounts of the polymeric and non-polymeric materials in the deposited hybrid layer. For example, a siloxane gas may be combined with varying amounts of oxygen to adjust the amount of non-polymeric material relative to the polymeric material in the hybrid layer. By increasing the stoichiometric ratio of oxygen in relation to the silicon or carbon, the amount of non-polymeric material, such as silicon oxides, may be increased. Similarly, by reducing the stoichiometric ratio of oxygen, the amount of silicon and carbon-containing polymeric material may be increased. The composition of the hybrid layer may also be varied by adjusting other reaction conditions. For example, in the case of PE-CVD, process parameters such as RF power and frequency, deposition pressure, deposition time, and gas flow rates can be varied.

Thus, by using the exemplary methods as described above, it is possible to form a hybrid layer of hybrid polymeric/non-polymeric character and having characteristics suitable for use in various applications, particular as a barrier film to reduce edge ingress of permeates. Such characteristics of the barrier film may include optical transparency (e.g., in some cases, the hybrid layer may be optically transparent or semi-transparent), impermeability, flexibility, thickness, adhesion, and other mechanical properties. For example, one or more of these characteristics may be adjusted by varying the weight % of polymeric material in the hybrid layer, with the remainder being non-polymeric material. For instance, to achieve a desired level of flexibility and impermeability, the wt % of polymeric material may preferably be in the range of 5 to 95%, and more preferably in the range of 10 to 25%. However, other ranges are also possible depending upon the application.

Exemplary Embodiments

In some embodiments, a first product may be provided. The first product may comprise a substrate having a first surface, a first side, and a first edge where the first surface meets the first side; and a device disposed over the substrate, the device having a second side, where at least a first portion of the second side is disposed within approximately 3.0 mm from the first edge of the substrate. The first product may further comprise a first barrier film that covers at least a portion of the first edge of the substrate, at least a portion of the first side of the substrate, and at least the first portion of the second side of the device. An exemplary embodiment was described above with reference to the product 900 shown in FIG. 9.

As used in this context, the term "within" refers to the overall distance between the portion of the device and the edge of the substrate, and is thereby not intended to require that the device be disposed inside the edges of the substrate (i.e. the device is not limited to having a side that does not extend beyond one of the edges of the substrate). That is, for example, if the device extends beyond the edge of the substrate by less than 3.0 mm, then it is considered to be "within" 3.0 mm of the edge of the substrate. Similarly, if the side of the device is disposed over the substrate but is less than 3.0 mm from the edge, it is also considered to be within 3.0 mm of the edge of the substrate. The term "within" is meant to be inclusive, and thereby covers distances of less than 3.0 mm as well.

Although the inventors have discovered that embodiments provided herein may be effective and advantageous when the device is disposed at a distance of up to and including 3.0 mm from an edge of the substrate, the inventors have also found that some embodiments disclosed herein are unexpectedly effective at preventing ingress at much shorter distances (i.e. less than 1.0 mm and ever more preferably at less than 0.1 mm). For example, the configuration of having the barrier layer cover portions of the vertical side of the substrate provides the ability to increase the length of the ingress path along the interface of the substrate and the barrier layer (e.g.

Path-2 (905) in FIG. 9), which is often the quickest path for contaminates to permeate into the active device area of the device. Moreover, the extension of the ingress path may be provided without increasing the thickness of the barrier film in the horizontal direction (i.e. the perpendicular length of the barrier layer from the side of the device), which may result in devices with reduced non-device edge areas that are typically associated with the use of edge seals. In this manner, embodiments provided herein may provide devices having no non-device edge area (or a very limited non-active edge area) along one or more sides of the device.

In this regard, in some embodiments of the first product as described above, at least the first portion of the second side of the device may be disposed within approximately 2.0 mm from the first edge of the substrate. In some embodiments, at least the first portion of the second side of the device may be disposed within approximately 1.0 mm from the first edge of the substrate. In some embodiments, at least the first portion of the second side of the device may be disposed within approximately 0.5 mm from the first edge of the substrate. In some embodiments, at least the first portion of the second side of the device may be disposed within approximately 0.1 mm from the first edge of the substrate. In some embodiments, at least the first portion of the second side of the device may be disposed within approximately 0.05 mm from the first edge of the substrate.

In some embodiments, in the first product as described above, the device may comprise an active device area and an inactive device area, and at least a portion of the active device area of the device may be disposed within 0.1 mm from the first edge of the substrate. That is, for example the border area of the product (comprising the non-device edge area and the inactive device area) may be less than 0.1 mm such that at least a portion of the active area may be disposed relatively close to the edge of the substrate. As noted above, the smaller the distance the active device area is disposed from the edge of the substrate, the less dead space the product may appear to have (at least for embodiments where the product comprises a lighting emitting device).

In some embodiments, in the first product as described above, the device may comprise an active device area, and at least a portion of the active device area of the device may be disposed within 0.1 mm from the first edge of the substrate. This may, but need not, correspond to a device that does not comprise an inactive device area, at least for a portion of the device that has an active device area that is disposed close to the edge of the substrate.

In some embodiments, in the first product as described above, the substrate may comprise any one of: a glass, a plastic, or a metal foil material. In general, any suitable substrate material may be used. It may be preferred in some embodiments that a material that may be readily broken (such as by cutting) is used to facilitate the process of exposing the sides of the device and substrate of the device. The exposed sides (or portions thereof) may then be covered using a barrier film to encapsulate the whole device or a portion thereof.

In some embodiments, in the first product as described above, the first barrier film may comprise a mixture of polymeric material and non-polymeric material. As noted above, although embodiments are not so limited, the inventors have generally found that this type of material may be preferred for use as a barrier layer because it may provide good properties with regard to both the bulk diffusion coefficient across the material and the diffusion coefficient at the interface with the substrate. This material has also been found to be capable of being deposited onto vertical surfaces, such as the side of the substrate and/or the device. In some embodiments, the first barrier film may comprise a mixture of polymeric silicon and inorganic silicon.

In some embodiments, in the first product as described above, the first barrier film may be disposed over at least a portion of the device. That is, the barrier layer may cover at least a portion of the device (i.e. the top surface in addition to one or more sides—or portions of the sides). In some embodiments, the first barrier film may be disposed over the entire device. In general, depositing the barrier film such that it is disposed over the device may be preferred in some instances because it may decrease manufacturing costs and complexity. In such embodiments, the barrier film could be deposited as a blanket layer in a single processing step, rather than requiring the use of a mask (which would have to be properly aligned). Moreover, the barrier film may also function as a top barrier layer (in addition to an edge sealant), which may either eliminate the need for an additional top sealant component, or it could be used in conjunction with a top encapsulation (such as glass and epoxy or another barrier film material) to provide additional protection again contaminates.

In some embodiments, in the first product as described above, the device may comprise a plurality of sides and the first barrier film may cover each of the plurality of sides of the device. That is, for instance, the barrier film may serve as an edge seal along each of the sides of the device. It should be noted that, in some embodiments where the barrier film covers a plurality of sides of the device, each of those sides of the device may, but need not, be disposed within 3.0 mm (more preferably within 1.0 mm; and more preferably within 0.1 mm) of an edge of the substrate. In some embodiments, the substrate may comprise a plurality of sides, and the first barrier film may cover at least a portion of each of the plurality of sides of the substrate. Again, it should be noted that such embodiments may have one or more portions of the device that is disposed at a distance of greater than 3.0 mm, although as noted above, it may generally be preferred that the sides of the device are each disposed as close to an edge of the substrate as practicable to reduce the size of the non-active edge area. In some embodiments, the substrate may comprise four sides and the first barrier film may cover at least a portion of at least two of the sides of the substrate. That is, a device may have no non-device edge areas (or a reduced non-device edge area) on two sides of the device based on the disposition of the sides of the device within a small distance (e.g. less than 3.0 mm; preferably less than 0.1 mm), of an edge of the substrate, but may have non-device edge areas, for instance, on the upper and lower portions of the front surface of a product (such as for user interface or hardware equipment such as cameras, speakers, etc.). In some such embodiments, the first barrier film may be disposed over the entire device; however, embodiments are not so limited.

In some embodiments, in the first product as described above, the first product may further comprise a second barrier film that may be disposed over the device. The first barrier film and the second barrier film may comprise different materials. In some embodiments, the second barrier film may comprise a glass, plastic, a plastic coated with a barrier film, or a metal foil material. For example, one of the more practical embodiments may be to use a plastic material coated with a barrier film as a second barrier layer to encapsulate the top of the device. The plastic material that is coated with a barrier film may thereby be considered a "second barrier film" as used herein. The plastic having the coated barrier film may be attached to the top of the device (e.g. so as to cover the device) in any suitable manner, including through the use of an epoxy.

In some embodiments, in the first product as described above, the substrate may have a first outer perimeter, and the device may have a second outer perimeter. As used herein, the "outer perimeter" may refer to the edge of the device or the substrate that forms a continuous or semi-continuous edge or interface around that component. That is, the "outer perimeter" may comprise the portions of the substrate or the device that are disposed at the farthest distance away from the center of the substrate or the device, respectively, in a direction that is perpendicular to the interface between the device and substrate. In some embodiments, at least approximately 50% of the second outer perimeter of the device may be disposed within approximately 1.0 mm from the first outer perimeter of the substrate. That is, for instance, if the device may comprise four equal length sides that comprise its perimeter, then this embodiment may comprise at least two of those sides disposed within 1.0 mm of a portion of the perimeter of the substrate (which comprises an edge of the substrate). In general, the larger the percentage of the outer perimeter of the active that is disposed at a short distance from the outer perimeter of the substrate, the less non-active edge area the device may have. In some embodiments, at least approximately 50% of the second outer perimeter of the device may be disposed within approximately 0.1 mm from the first outer perimeter of the substrate. In some embodiments, at least approximately 75% of the second outer perimeter of the device may be disposed within approximately 1 mm from the first outer perimeter of the substrate. In some embodiments, at least approximately 75% of the second outer perimeter of the device may be disposed within approximately 0.1 mm from the first outer perimeter of the substrate.

For embodiments where the device comprises a curved side or sides (e.g. when the outer perimeter of the device or a portion thereof is curved), then embodiments in which 50% of the second outer perimeter of the device may be disposed within approximately 1.0 mm from the first outer perimeter of the substrate may correspond to having 50% of the length of the outer perimeter (i.e. the curved side) of the device disposed within 1.0 mm of any portion of the edge of the substrate (e.g. the outer perimeter of the substrate). In some embodiments, at least 10% of the second outer perimeter of the device (e.g. having a curved perimeter) may be disposed within approximately 3.0 mm (preferably within 1.0 mm, and more preferably within 0.1 mm) from the first outer perimeter of the substrate (i.e. the edge of the substrate). In some embodiments, at least 30% (preferably at least 50%, and more preferably at least 75%) of the second outer perimeter of the device (e.g. having a curved perimeter) may be disposed within approximately 3.0 mm (preferably within 1.0 mm, and more preferably within 0.1 mm) from the first outer perimeter of the substrate (i.e. the edge of the substrate). In some embodiments, the substrate may also have a curved perimeter, although embodiments are not so limited.

In some embodiments, in the first product as described above, the first barrier film may have been deposited using chemical vapor deposition CVD and an organosilicon precursor. In general, CVD (and preferably PE-CVD) may comprise an efficient manner of depositing the barrier film (particularly when the barrier film comprises a blanket layer), although embodiments are not so limited. Moreover, vapor deposition techniques have been found by the inventors to be an effective way to deposit barrier film materials on vertical surfaces.

In some embodiments, the first product may comprise anyone of: a solar cell, a thin film battery, an organic electronic device, a lighting panel or a lighting source having a lighting panel, a display or an electronic device having a display, a mobile phone, a notebook computer, a tablet computer, or a television.

In some embodiments, in the first product as described above, the device may comprise an organic layer. In some embodiments, the device comprises an OLED. As noted above, many of the examples provided herein relate to organic lighting devices (such as lighting panels or displays). While this may be a preferred embodiment because the non-active edge areas are typically noticeable to a viewer when observing the light source, embodiments are not so limited.

In some embodiments, the first product as described above, the first product may further comprise an electronics packaging, where the electronics packaging has at least a dimension that is less than that of the device footprint. The "electronics packaging" may refer to any and/or all of the electronic components that comprise the first product that are not integrally coupled to or disposed within the device. In general, if the device does not have a non-device edge area around its sides (or such areas are relatively small and not noticeable to a user of the device) that are attributable to an edge seal or barrier film then the advantage provided by such embodiments (at least from an aesthetic perspective) may not be as beneficial if other components extend around the device on any sides. In some embodiments, illustrated by comparing a cross-section of device 901 to a cross-section of electronics packaging 914 in FIG. 9 the electronics packaging may have a total area that is less than the total area of the device footprint. As used in this context the "total area" may generally refer to the area of the packaging disposed substantially parallel to the device footprint. Thus, for example, if the total area of the electronics packaging is less than that of the device footprint, than the electronics packaging may be completely covered by the device such that the packaging may not be visible to a user. In such embodiments, the product may not have any non-device edge areas.

In some embodiments, in the first product as described above, the first product may further comprise a plurality of devices. That is, for instance, a product may comprise a plurality of OLEDs that may be electrically connected and/or disposed on a single surface (such as when a display or lighting panel may be tiled). In some embodiments, each of the plurality of devices may be disposed at a distance of less than 6.0 mm from at least one of the other devices. This could, for instance, comprise embodiments where each of the devices has 3.0 mm of non-device edge area disposed around its sides contributed by, for instance, the barrier film that is forming an edge seal. When the devices are disposed adjacent to one another (for instance in a 4×4 or 6×6 grid array), the distance between each device will be equivalent to the non-device edge area around each of the devices in a direction perpendicular to a side of each of the devices. Therefore, the smaller the non-device edge area around each device, the less dead space the device will have—making the tiling effect less noticeable to an observer. In some embodiments, each of the plurality of devices is disposed at a distance of less than 4.0 mm from at least one of the other devices. In some embodiments, each of the plurality of devices may be disposed at a distance of less than 2.0 mm from at least one of the other devices. In some embodiments, each of the plurality of devices may be disposed at a distance of less than 1.0 mm from at least one of the other devices. In some embodiments, each of the plurality of devices may be disposed at a distance of less than 0.1 mm from at least one of the other devices. As noted above, embodiments provided herein may provide an effective edge sealant without requiring, in some embodiments, that the barrier film have a large perpendicular distance extending away from the device footprint.

In this regard, in some embodiments, in the first product as described above, where the product comprises a plurality of devices, the plurality of devices may be disposed on the same substrate. In some embodiments, the plurality of devices may be disposed on different substrates. In some embodiments, the plurality of devices may comprise at least two devices that emit light having a peak wavelength that is different. In some embodiments, the first product may comprise a display. In general, tiling light emitting devices may provide efficiencies in manufacturing (e.g. it may be easier to fabricate a plurality of smaller devices rather than one large device) and a more robust system (e.g. if one of the devices fails then only that device may need to be replaced rather than having to replace the entire device).

Exemplary embodiments comprising tiling of two separate devices may be as follows: in some embodiments, the tiled product may comprise a first substrate having a first surface, a first side, and a first edge where the first surface meets the first side; a second substrate having a first surface, a first side, and a first edge where the first surface meets the first side; and a plurality of devices that comprises a first device and a second device. The first device may be disposed over the first substrate and have a second side, where at least a first portion of the second side of the first device is disposed within approximately 3.0 mm from the first edge of the first substrate. The tiled device may further comprise a first barrier film that covers at least a portion of the first edge of the first substrate, at least a portion of the first side of the first substrate, and at least the first portion of the second side of the first device. The second device may be disposed over the second substrate and have a have a second side, where at least a first portion of the second side of the second device is disposed within approximately 3.0 mm from the first edge of the second substrate. The tiled device may further include a second barrier film that covers at least a portion of the first edge of the second substrate, at least a portion of the first side of the second substrate, and at least the first portion of the second side of the second device. In some embodiments, in the tiled device as described above, the first portion of the second side of the first device may be disposed at a distance of less than 6.0 mm of the first portion of the second side of the second device. In some embodiments, the first portion of the second side of the first device may be disposed at a distance of less than 2.0 mm of the first portion of the second side of the second device. In some embodiments, the first portion of the second side of the first device may be disposed at a distance of less than 1.0 mm of the first portion of the second side of the second device.

In some embodiments, in the first product as described above, the first device may comprise an active device area and an inactive device area; the second device may comprise an active device area and an inactive device area; and at least a portion of the active device area of the first device is disposed at a distance of less than 1.0 mm of at least a portion of the active device area of the second device. In general, the shorter the distance between the active device areas (as opposed to just the device footprints, which may also include inactive device area) of each of the plurality of devices, the less perceivable any border area between the devices may be to an observer (at least for light emitting products such as displays or lighting panels).

In some embodiments, in the first product as described above, the first device may comprise an active device area; the second device may comprise an active device area; and at least a portion of the active device area of the first device may be disposed at a distance of less than 0.01 mm of at least a portion of the active device area of the second device.

In some embodiments, in the first product as described above, the substrate may further comprise a second surface and a plurality of electrical conductors may be disposed within the substrate, where each of the plurality of conductors extends from the first surface to the second surface of the substrate. As was described in detail above with reference to FIGS. 10 and 11, providing a device often requires that current or voltage be supplied to electrical components (such as electrodes) disposed on opposing surfaces of the substrate. In some embodiments, each of the electrical conductors may be disposed within a micro-hole. That is, one or more vias may be provided through the substrate to make the electrical connections. In some embodiments, the substrate may comprise an outer perimeter and each of the plurality of conductors may be disposed within 1.0 mm of the outer perimeter. Although the micro-holes may be relatively small, each one may in fact create inactive device areas in the device and therefore the inventors have found that my moving these components toward the edge of the device, their effect may be minimized to an observer (e.g. when the device is a light emitting device). However, embodiments are not so limited, and in some instances, where the substrate comprises an outer perimeter, at least one of the conductors may be disposed at a distance of greater than 1.0 mm from the outer perimeter of the substrate.

In some embodiments, in the first product as described above, the first product may further comprise a plurality of electrical conductors that may be disposed on the first side of the substrate. In some embodiments, the substrate may further comprise a second surface and each of the plurality of conductors may extend from the first surface to the second surface of the substrate. That is, in some embodiments, the electrical conductors may, but need not, be disposed within the substrate (e.g. using one or more vias). That is, for instance, the plurality of conductors could be disposed on (or over) one or more of the sides of the substrate (e.g. the conductors may be patterned conductors disposed across a portion of the side of the substrate).

In some embodiments, in the first product as described above where the substrate comprises a second surface and a plurality of conductors either disposed within the substrate or disposed on the first side of the substrate, the first product may further comprise a plurality of electrodes disposed over the substrate. In some embodiments, each of the plurality of electrical conductors may be electrically connected to at least one of the plurality of electrodes. In some embodiments, the electrical connection between the plurality of electrodes and the plurality of electrical conductors may comprise a patterned conductive trace and/or bus line disposed on the first surface of the substrate.

Embodiments may also provide a first method. The first method may include the steps of providing a substrate having: a first surface, a first side, and a first edge where the first surface meets the first side; and a device disposed over the first surface of the substrate, the device having a second side. At least a first portion of the second side of the device may be disposed not more than 3.0 mm from the first edge of the substrate. After providing the substrate, the first method further includes the step of fabricating a first barrier film so as to cover at least a portion of the first edge of the substrate, at least a portion of the first side of the substrate, and at least the first portion of the second side of the device.

The term "providing" is generally used in this context to be an inclusive term and encompass any manner of obtaining or making available a substrate having a device disposed over the substrate for use in such methods. For instance, in some embodiments, the substrate and the device (and/or components thereof) may be acquired, such as by purchase from a third party. In some embodiments, the substrate and/or device could be fabricated, manufactured, or otherwise assembled, or the components could be provided to a third party that may then fabricate or assemble the substrate having a device disposed thereon.

Similarly, the term "fabricating" is also intended to be an inclusive term, and may comprise any suitable deposition process or other technique for disposing the barrier film so as to cover the portions of the side and edge of the of the substrate and the side of the device. This could include, by way of example only, vacuum depositing a blanket layer of barrier film or a patterned layer through a mask, solution depositing, etc.

In some embodiments, in the first method as described above, at least the first portion of the second side may be disposed not more than 2.0 mm from the first edge. In some embodiments, at least the first portion of the second side may be disposed not more than 1.0 mm from the first edge. In some embodiments, at least the first portion of the second side may be disposed not more than 0.5 mm from the first edge. In some embodiments, at least the first portion of the second side may be disposed not more than 0.1 mm from the first edge.

In some embodiments, in the first method as described above, the device may comprise an active device area; and at least a portion of the active device area of the device may be disposed within 0.1 mm from the first edge of the substrate.

In some embodiments, in the first method as described above, the first barrier film may comprise a mixture of polymeric material and non-polymeric material. In some embodiments, the first barrier film may comprise a mixture of polymeric silicon and inorganic silicon.

In some embodiments, in the first method as described above, the step of providing a substrate may include the steps of: scribing the substrate at a plurality of positions, depositing the device over the first surface of the substrate, and breaking the substrate at the plurality of scribed positions. As used in this context, "breaking" may comprise any suitable method of separating the substrate into a plurality of separate segments or pieces (such as snapping the substrate or applying pressure along the scribed positions). Breaking the substrate at the scribed positions should expose the vertical side of the substrate (in some embodiments, the side of the device may also be exposed if it has already been deposited over the substrate), such that the barrier film may be deposited over each of these portions. As used in this context, a "plurality of scribe positions" may refer to any shape or disposition of the scribe along a surface of the substrate, such as a line, a plurality of dots, a curve, or any other shape or configuration of the scribing such that the substrate may break along predetermined locations. In some embodiments, the step of breaking the substrate may be performed before the device is deposited over the first surface of the substrate. In some embodiments, the step of breaking the substrate may be performed after the device is deposited over the first surface of the substrate.

As noted above, breaking the substrate at the scribed positions after the device is deposited should expose the vertical side of the substrate and of the device. By breaking the substrate after the device is deposited, the inventors have found that it is less likely that the edge of the substrate will be contaminated with any other particles (such as organic material). Contaminants may affect the ease with which permeants ingress into the device toward the active device area. Therefore, the inventors have found that it may be generally preferred to break the substrate to expose the sides of the substrate and the device after the device is deposited but before the deposition of the barrier film. Moreover, the breaking step may be performed in a vacuum to prevent or reduce additional contamination of the device.

In some embodiments, in the first method as described above, the step of providing a substrate may include the steps of: depositing the device over the first surface of the substrate; after the device is deposited, scribing the substrate and the device at a plurality of positions; and breaking the substrate and the device at the plurality of scribed positions. Thus, in this exemplary embodiment, both the substrate and the device may be scribed and then broken (rather than just the substrate) to expose the sides to be covered (at least partially) by the barrier film.

In some embodiments, in the first method as described above, the step of providing a substrate may include the step of depositing the device over the entire first surface of the substrate. That is, for example, some embodiments may utilize a deposition mask that is larger than the area of the first surface of the substrate such that the device will be disposed over the entire surface of the substrate. In some instances, this embodiment may not be preferred because it may result in some of the material of the active layer being disposed on the side of the substrate (i.e. the side of the substrate may be contaminated). In some embodiments, the step of providing a substrate may include the step of depositing the device through a mask having an opening that is larger than the first surface of the substrate.

In some embodiments, in the first method as described above, the step of providing a substrate may include the steps of: depositing the device over the first surface of the substrate; and after the device is deposited, breaking the substrate and the device at a plurality of places. As used in this context, the term "breaking" may generally refer to any manner of separating the substrate and/or the device into smaller components or sections. It can include cutting, ablation, tearing, scribing and separating, etc. In some embodiments, the step of breaking the substrate and the device may comprise cutting the device and the substrate. This may comprise a relatively simple yet effective way of exposing the sides of the device and the substrate.

In some embodiments, in the first method as described above, the step of providing a substrate may include the steps of: depositing the device over the first surface of the substrate; after the device is deposited, ablating a portion of the device to expose the second side of the device; and after the device is deposited, ablating a portion of the substrate to expose the first side. As used in this context, "ablating a portion of the substrate," may comprise separating the substrate (e.g. the ablation may extend from the top surface of the substrate to the bottom surface of the substrate so as to separate the substrate into two components). However, embodiments are not so limited. In some embodiments, a part of the substrate may be ablated so as to expose a portion of the substrate. The barrier film may then be deposited such that it may cover some, or all, of the exposed portion of the substrate (as well as one or more sides of the device). The substrate may then be broken so as to form two separate components. This is illustrated in FIGS. 15(a)-(d), and described below.

Figure 15A:
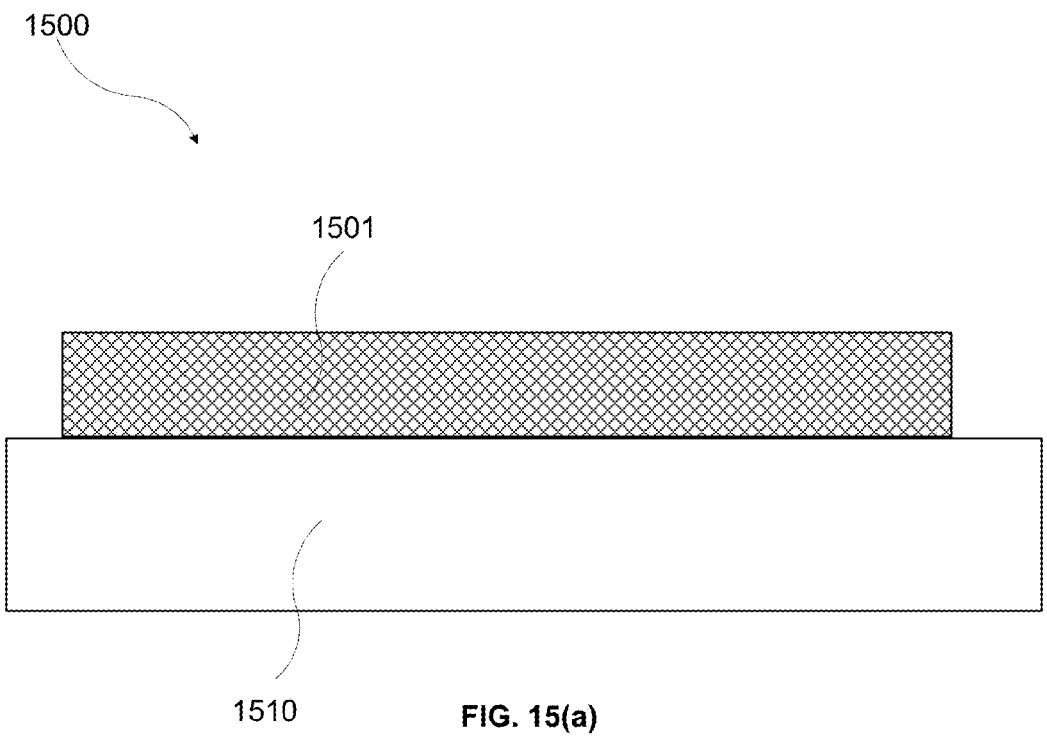
FIGS. 15(a)-(d) show an exemplary device and fabrication process in accordance with some embodiments.
Figure 15B:
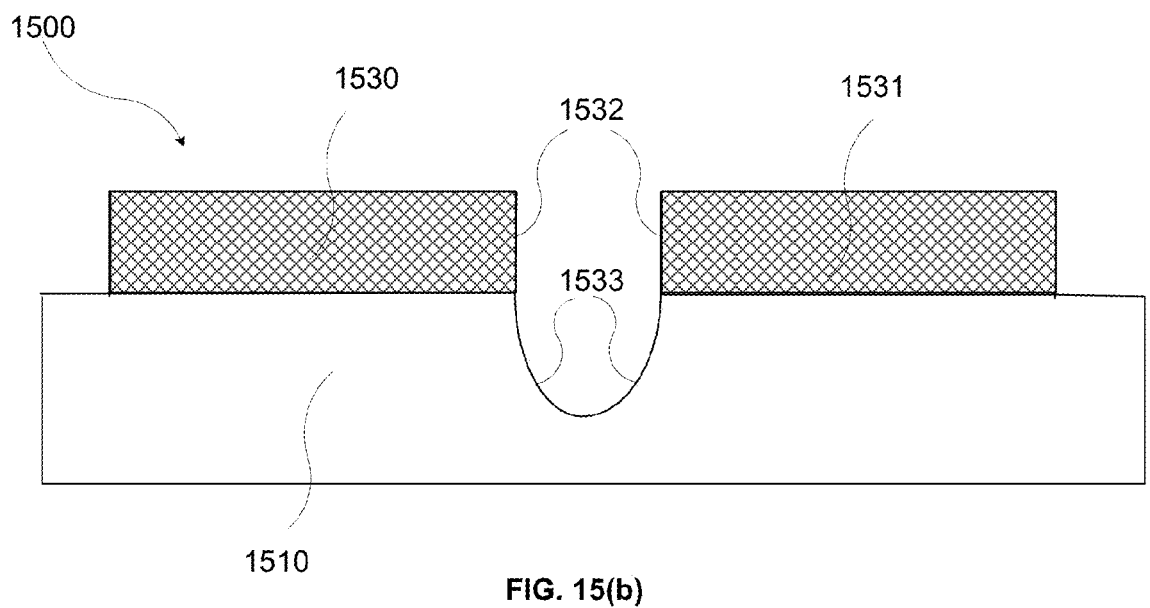
Figure 15C:
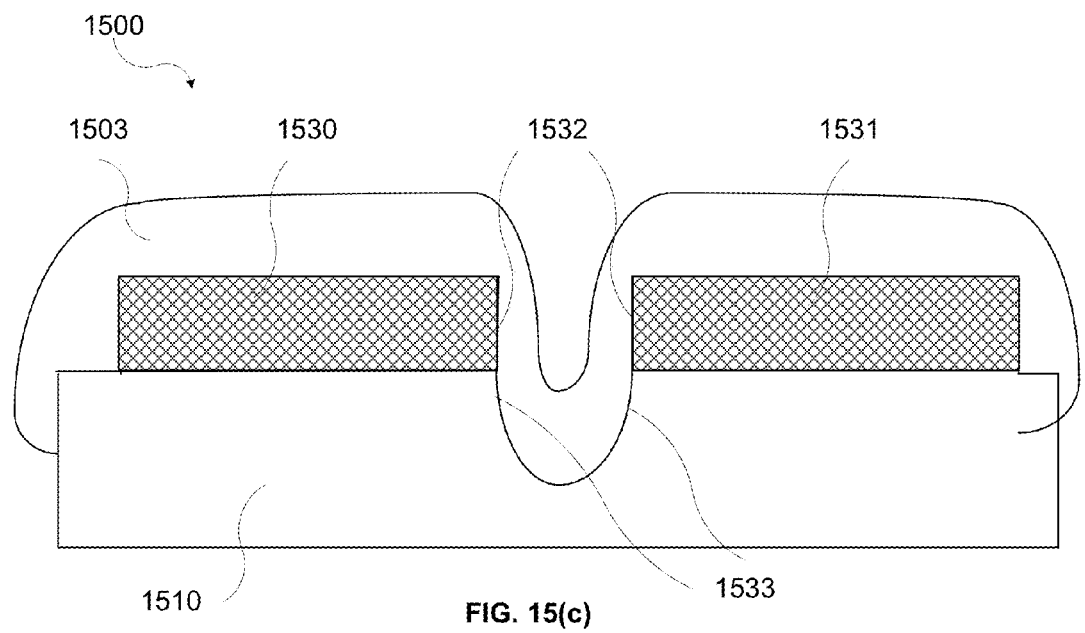
Figure 15D:
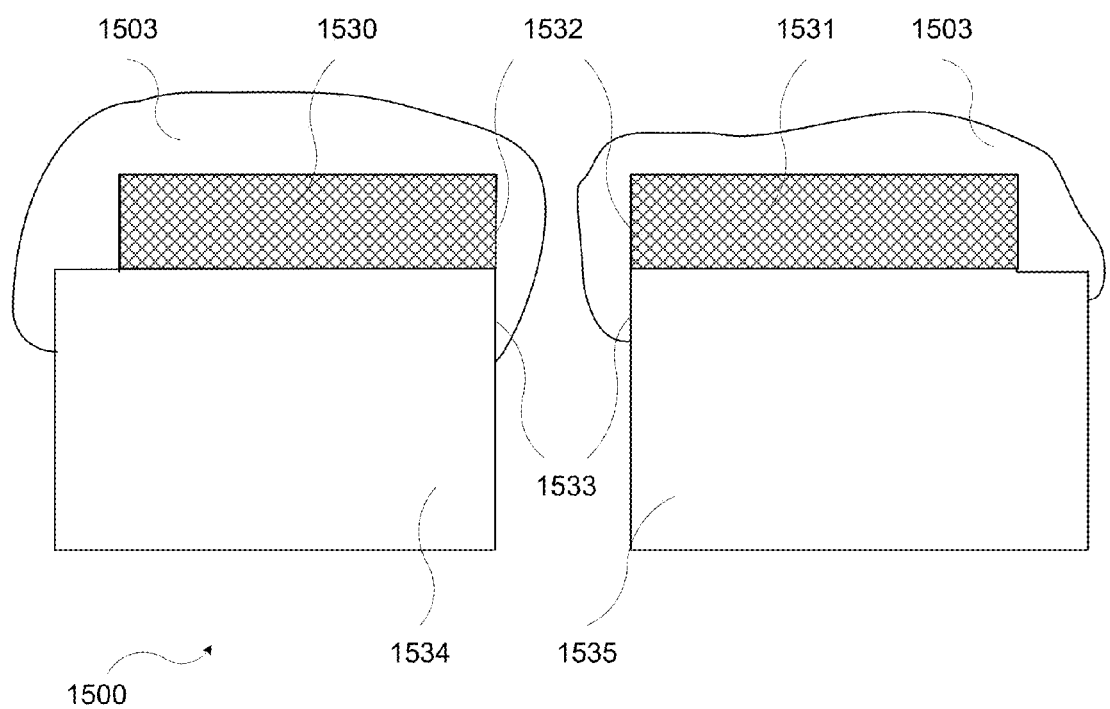

FIG. 15(a) shows a product 1500 having a substrate 1510 and a device 1501 disposed over the surface of the substrate 1510. FIG. 15(b) shows the same device after an ablation process step, in which the device 1501 has been ablated to form two physically separate devices: 1530 and 1531. The ablation of the device 1501 exposed a side 1532 of each of the devices 1530 and 1531. The ablation process is also shown as having ablated a part of substrate 1510, but has not completely separated the substrate 1510 into two separate regions.

However, the ablation process exposed a portion of the substrate 1533. FIG. 15(*c*) shows the same product 1500 after a barrier film 1503 has been blanket deposited over the devices 1530 and 1531 and portions of the substrate 1510. As shown the barrier film 1503 was disposed so as to cover both the sides of devices 1530 and 1531, as well as portions of the substrate 1510 (including the exposed region 1533). FIG. 15(*d*) further shows the product 1500 after the substrate 1510 has been broken into two separate physical components: 1534 and 1535. As shown, the barrier layer 1503 covers the devices 1530 and 1531 as well as portions of the sides of each substrate component 1534 and 1535—including the previously exposed portions of sides 1533. Moreover, the devices 1530 and 1531 are shown as having sides 1532 that are disposed over an edge of the substrate components 1534 and 1535, respectively. In this manner, the devices 1530 and 1531 may have sides 1532 that are disposed within a small distance from an edge of the substrate that each is disposed over (e.g. less than 3.0 mm; preferably less than 1.0 mm; more preferable less than 0.1 mm). This process may provide better control of the portion of the exposed side of the substrate that is covered by the barrier film because the initial depth of the ablation of the substrate may be controlled before the barrier film is deposited.

Figure 16:
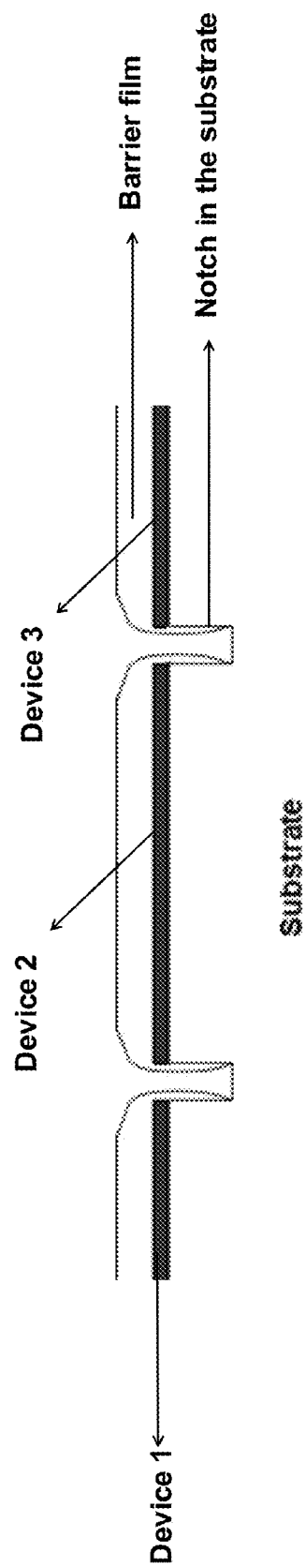
FIG. 16 show an exemplary device and fabrication process in accordance with some embodiments.
Figure 17:
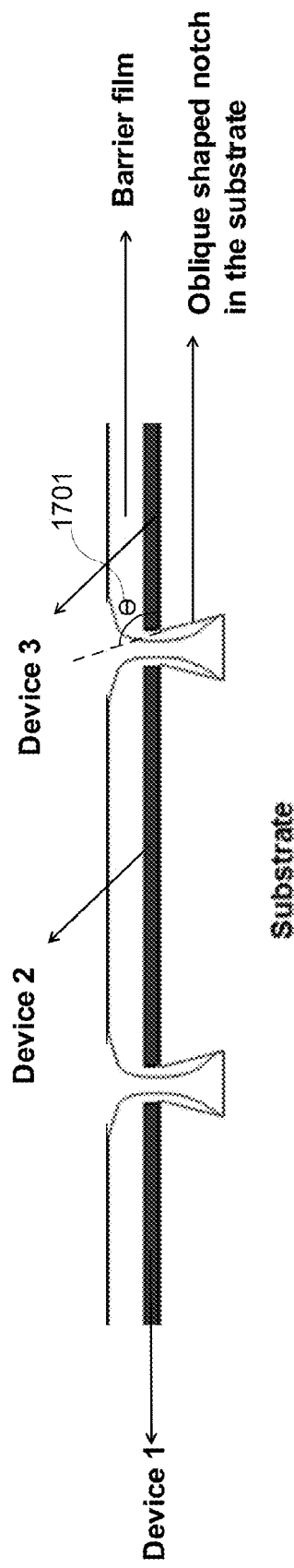
FIG. 17 show an exemplary device and fabrication process in accordance with some embodiments.

In some embodiments, multiple devices may be prepared (e.g. disposed or deposited) on a single substrate (similar to how many displays are prepared on a large size glass). In some such embodiments, to minimize the non-device edge area around the individual devices without compromising the shelf life of the device, the substrate can be prepared with notches as shown in FIGS. 16 and 17. As shown in FIG. 16, the devices may be deposited on the notched substrate followed by deposition by the barrier film. Different size shadow masks may be used for the device layers and barrier film deposition to prevent (or reduce) the device layers being deposited into the notches and potentially interfering with the proper functioning of the barrier film. The barrier film itself may be deposited on the vertical surface of the notches, thereby providing extra edge length for added shelf life (e.g. by increasing the ingress path of permeants along the interface with the substrate). The devices can then be separated using any suitable method, such as those described herein.

FIG. 17 shows another embodiment where the notches do not have vertical walls but make an obtuse angle 1701 with the top surface of the substrate. Such oblique cross-section may prevent the physical vapor deposition layers (such as organic layers of an OLED) to be deposited on the walls of the notch because they preferably follow line-of-sight deposition. However, the barrier film, which usually is deposited using chemical vapor deposition, may be deposited on the walls allowing the barrier film to have additional edge length to protect the device from permeants. This pre-notching of the substrate may provide extra edge length to the barrier when used for a manufacturing process where multiple devices are prepared on a single substrate. The substrate can be cleaned after notching to get rid of the particles that may be generated during the notching.

In this regard, in some embodiments, in the first method as described above, the step of providing the substrate may comprise creating a plurality of notches on the first surface of the substrate, after creating the plurality of notches, disposing a plurality of devices over the first surface of the substrate such that each of the plurality of devices is separated from each of the other devices by at least one of the plurality of notches, and after the barrier layer is deposited, breaking the substrate along the plurality of notches. In some embodiments, each notch of the plurality of notches may comprise a first wall and a second wall and at least one of the first wall or the second wall may form an obtuse angle with the first surface of the substrate prior to breaking the substrate along the plurality of notches.

In some embodiments, in the first method as described above, after depositing the first barrier film, the method may further comprise the step of breaking the substrate.

In some embodiments, in the first method as described above, the first method may further comprise the step of forming a plurality of conductive paths from the first surface of the substrate to a second surface of the substrate. In some embodiments, the step of forming a plurality of conductive paths may include the steps of: fabricating a plurality of vias in the substrate from the first surface to the second surface; and disposing conductive material in each of the plurality of vias.

In some embodiments, in the first method as described above comprising the step of forming a plurality of conductive paths from the first surface of the substrate to a second surface of the substrate, the step of forming a plurality of conductive paths may comprise disposing conductive material on the first side of the substrate. In some embodiments, the step of disposing conductive material on the first side of the substrate comprises any one of, or some combination of: direct printing the conductive material over a portion of the first side to form the plurality of conductive paths; disposing a conductive layer over at least a portion of the first side and patterning the conductive layer to form the plurality of conductive paths; depositing a conductive layer using a vacuum process and patterning the conductive layer to form the plurality of conductive paths; and/or dipping the first side of the substrate into a conductive material and patterning the conductive material to form the plurality of conductive paths.

Embodiments may also provide a first product prepared by a process. The process may include the steps of providing a substrate having a first surface, a first side, and a first edge where the first surface meets the first side; and a device disposed over the first surface of the substrate having a second side, where at least a first portion of the second side is disposed not more than 3.0 mm from the first edge (and preferably not more than 1.0 mm). The process may further include the step of depositing a first barrier film so as to cover at least a portion of the first edge of the substrate, at least a portion of the first side of the substrate, and at least the first portion of the second side.

In some embodiments, in the first product prepared by the process as described above, the first barrier film may comprise a mixture of polymeric material and non-polymeric material. As described above, the inventors have found that such a barrier layer may have properties that may both restrict the ingress of moisture as well as, in some instances, allow for depositing the material on a vertical surface.

In some embodiments, in the first product prepared by the process as described above, the step of depositing the first barrier film may comprise using an organosilicon precursor. In some embodiments, the step of depositing the first barrier film may comprise chemical vapor deposition CVD. In some embodiments, the chemical vapor deposition may be plasma-enhanced.

In some embodiments, in the first product prepared by the process as described above where the step of depositing the first barrier film comprise vapor deposition using an organosilicon precursor, the barrier film may consist essentially of a mixture of polymeric silicon and inorganic silicon. In some embodiments, the weight ratio of polymeric silicon to inorganic silicon may be in the range of 95:5 to 5:95. In some embodiments, the polymeric silicon and the inorganic silicon may be created from the same precursor material. In some embodiments, at least a 0.1 µm thickness of the barrier film may be deposited under the same reaction conditions for all the reaction conditions in the deposition process. In some embodiments, the water vapor transmission rate may be less than $10^{-6}$ g/m²/day through the at least 0.1 µm thickness of the barrier film.

In some embodiments, in the first product prepared by the process as described above where the step of depositing the first barrier film comprise vapor deposition using an organosilicon precursor, the precursor material may comprise hexamethyl disiloxane or dimethyl siloxane. In some embodiments, the precursor material may comprise a single organosilicon compound. In some embodiments, the precursor material comprises a mixture of organosilicon compounds.

Embodiments may also provide a first product. The first product may comprise a substrate having a first surface, a first side, and a first edge where the first surface meets the first side; and a device disposed over the substrate having a second side; wherein at least a first portion of the second side is disposed within approximately 1.0 mm from the first edge of the substrate. The device may comprise a first organic material. In some embodiments, no portion of the first side of the first substrate is covered by more than $6\times10^{13}$ atoms/cm² of the first organic material. That is, these embodiments may correspond to a product that is in an intermediate production step where the substrate has a side that does not comprise any organic material disposed thereon. For example, the intermediate product may correspond to a part of the fabrication process after the step where the organic material of the device has been deposited on the first substrate, and after the substrate has been broken to expose the side of the substrate that is disposed within 1.0 mm of the side of the device, but before the barrier film has been deposited. The organic material was deposited before the side of the substrate was exposed and therefore the side will likely not have a significant amount of the organic layer disposed thereon. In this regard, in some embodiments, in the first product as described above, the first organic material does not cover any portion of the first side of the substrate.

In some embodiments, the first product as described above may further comprise a first barrier film that covers at least a portion of the first edge of the substrate, at least a portion of the first side of the substrate, and at least the first portion of the second side of the device.

In some embodiments, in the first product as described above, at least the first portion of the second side of the device may be disposed within approximately 0.1 mm from the first edge of the substrate.

Embodiments may also provide a first method. The first method may include the steps of providing a substrate having: a first surface, a first side, and a first edge where the first surface meets the first side; and a device disposed over a first surface of the substrate; and breaking the device so as to expose a second side of the device such that at least a first portion of the device is disposed not more than 3.0 mm from the first edge. In some embodiments, at least the first portion of the device may be disposed not more than 2.0 mm from the first edge. In some embodiments, at least the first portion of the device may be disposed not more than 1.0 mm from the first edge. In some embodiments, at least the first portion of the device is disposed not more than 0.1 mm from the first edge.

In some embodiments, in the first method as described above, the device may comprise an active device area; and at least a portion of the active device area of the device may be disposed not more than 0.1 mm from the first edge of the substrate.

In some embodiments, in the first method as described above, the step of providing a substrate having a first side and a first edge may include the step of breaking the substrate along the first side. In some embodiments, the steps of breaking the substrate and breaking the device may comprise the same step. As used in this context, the term "comprise the same step," may generally refer to when the breaking both the substrate and the device may occur simultaneously during a single process steps or through multiple process steps.

In some embodiments, in the first method as described above and after the step of breaking the device, the method may further comprise the step of depositing a first barrier film so as to cover at least a portion of the first edge of the substrate, at least a portion of the first side of the substrate, and at least the first portion of the second side of the device. In some embodiments, the steps of breaking the device and depositing a first barrier film may be performed in a vacuum. In some embodiments, the first barrier film may comprise a mixture of polymeric silicon and inorganic silicon. In some embodiments, the step of breaking the device may comprise cutting the device.

In some embodiments, a first product may be provided having at least a portion of the outer perimeter of the device that overlaps with that of the substrate that it is disposed on (i.e. the device and the substrate may share the same (more or less) vertical edge. In some embodiments, the device may be thin film encapsulated with a barrier film covering the side of the active component and the substrate. In some embodiments, the encapsulation film is grown in PE-CVD using an organosilicon precursor. In some embodiments, another layer having a good barrier property may be applied on top of the barrier and device. In some embodiments, there may be no non-device edge areas around some or all the edges of the device because there may be a plurality of openings within the device for electrical contacts. In some embodiments, the first product may comprise an electronic device/gadget (such as a smart phone) with no non-device edge areas around an OLED panel. In some embodiments, the first product may comprise tiling a plurality of panels having no non-device edge areas to form a larger device.

In some embodiments, a method of generating a device may comprise: growing a device on substrate; exposing the vertical sides of the device and at least part of substrate; and depositing a thin film to encapsulate both the top and sides of the device and substrate.

Experimental Verification

Figure 13:
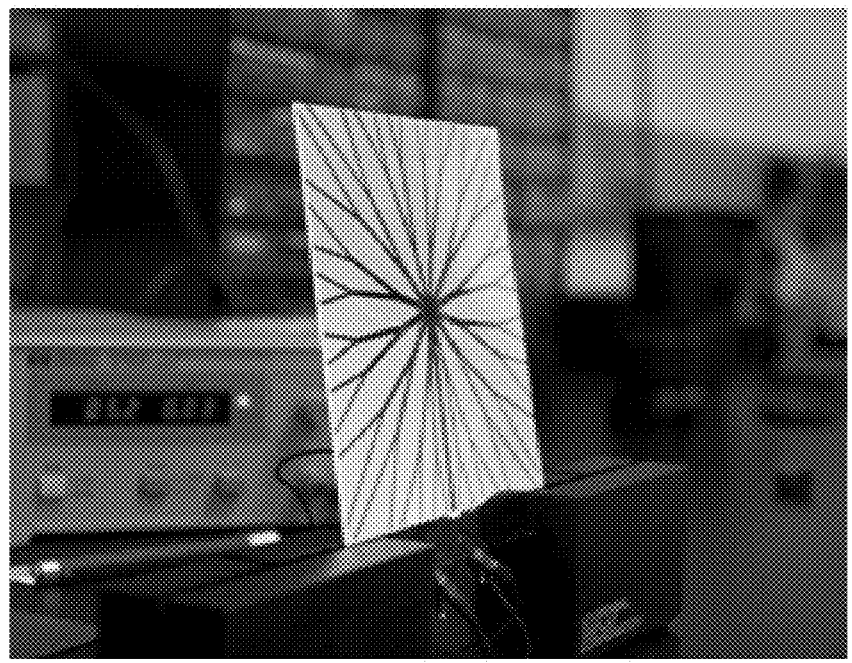
FIG. 13 comprises two photographs of an experimental device just after fabrication in accordance with some embodiments.
Figure 13:
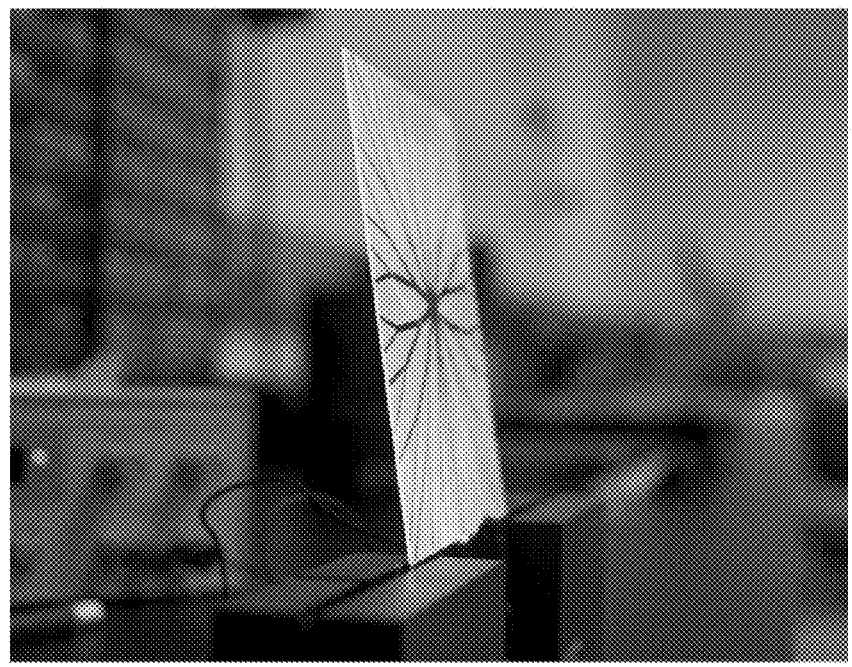
Figure 14:
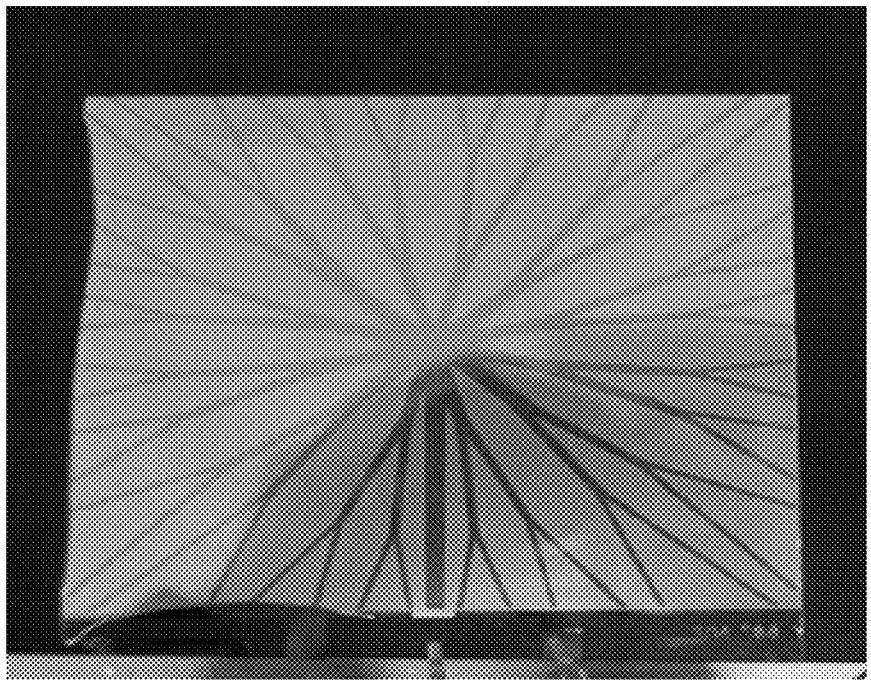
FIG. 14 comprises two photographs of the experimental device from FIG. 13 21 hours after fabrication in accordance with some embodiments.
Figure 14:
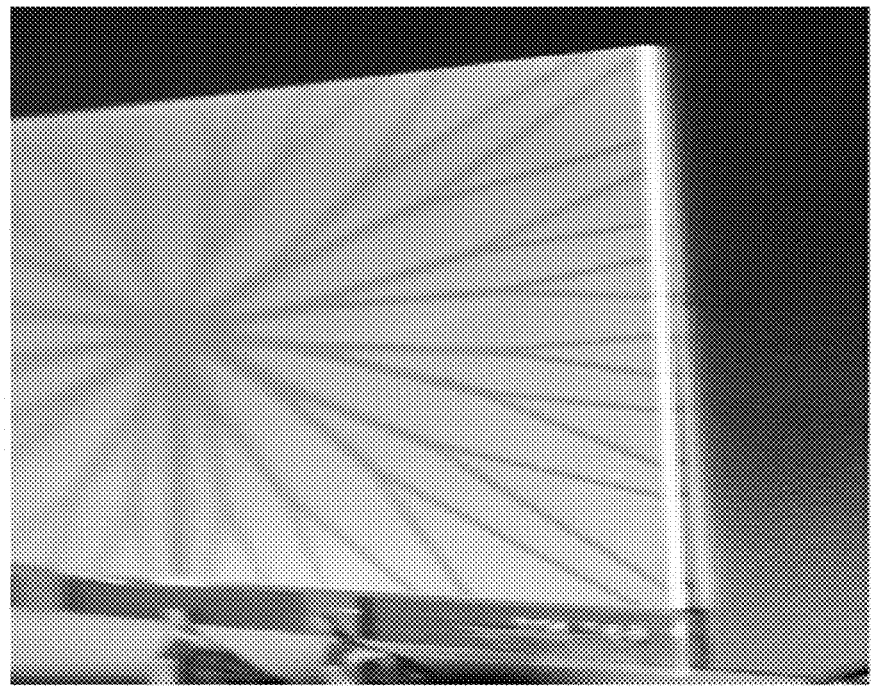

FIGS. 13 and 14 comprise photographs of an exemplary product that is borderless or near borderless on three sides of the product. This example is provided for illustration purposes only and is not meant to be limiting. Again, although the exemplary embodiment comprises an OLED display, embodiments are not so limited.

A large area OLED lighting panel that had electrical contacts on only one edge of the device was used to verify the no non-device edge area (e.g. borderless or near borderless) device concept. Initially, the glass substrate was scribed on the back side (non-deposited side) of the substrate just inside the edges of where the organic material of the active device area of the OLED was to be deposited. The substrate was then mounted onto a backing plate using a thermally conductive polymer (Fuji-Poly®). This was done to prevent the substrate from breaking during processing. The substrate was supported in the carrier only by the edges in which the three sides were scribed to be broken-off after processing. Next, a standard transparent PHOLED device was deposited (i.e. grown) on the surface of the substrate. The substrate was then removed to the glove box where the three edges were snapped off without removing the substrate from the backing plate. The substrate was reloaded into the deposition system where a barrier film comprising a hybrid material (i.e. a mixture of polymer and non-polymer material) was deposited. The barrier film was deposited over the entire device and over portions of the three exposed sides of the substrate. FIG. 13 shows two pictures showing the lighting panel that was made using the above steps just after fabrication and encapsulation.

FIG. 14 comprises pictures of the same panel after twenty-one hours of storage in ambient room temperature and humidity. As can be seen from the photographs in FIG. 14, there is no degradation of the OLED device on any of the cut edges. Small dark spots were observed in the device; however, these were a result of large particles on the device prior to the hybrid barrier encapsulation process.

As noted above, the method in this example utilized by the inventors in forming the OLED lighting panel used the following process sequence: 1) scribing the back side of substrate; 2) growing the device on the front side; 3) breaking the substrate at the pre-scribed places to expose the vertical side of the device and the substrate; and 4) applying barrier film encapsulation to cover both the top and vertical sides of the device (i.e. the OLED) and the vertical side of the substrate. As noted above, other steps could also be used.

CONCLUSION

It is understood that the various embodiments described herein are by way of example only, and are not intended to limit the scope of the invention. For example, many of the materials and structures described herein may be substituted with other materials and structures without deviating from the spirit of the invention. The present invention as claimed may therefore include variations from the particular examples and preferred embodiments described herein, as will be apparent to one of skill in the art. It is understood that various theories as to why the invention works are not intended to be limiting.

The above description is illustrative and is not restrictive. Many variations of the invention will become apparent to those skilled in the art upon review of the disclosure. The scope of the invention should, therefore, be determined not with reference to the above description, but instead should be determined with reference to the pending claims along with their full scope or equivalents.

Although many embodiments were described above as comprising different features and/or combination of features, a person of ordinary skill in the art after reading this disclosure may understand that in some instances, one or more of these components could be combined with any of the components or features described above. That is, one or more features from any embodiment can be combined with one or more features of any other embodiment without departing from the scope of the invention.

As noted previously, all measurements, dimensions, and materials provided herein within the specification or within the figures are by way of example only.

A recitation of "a," "an," or "the" is intended to mean "one or more" unless specifically indicated to the contrary. Reference to a "first" component does not necessarily require that a second component be provided. Moreover reference to a "first" or a "second" component does not limit the referenced component to a particular location unless expressly stated.

All publications mentioned herein are incorporated herein by reference to disclose and describe the methods and/or materials in connection with which the publications are cited. The publications discussed herein are provided solely for their disclosure prior to the filing date of the present application. Nothing herein is to be construed as an admission that the present invention is not entitled to antedate such publication by virtue of prior invention. Further, the dates of publication provided may be different from the actual publication dates, which may need to be independently confirmed.

What is claimed is:

1. A first product comprising:
   a substrate having a first surface, a first side, and a first edge where the first surface meets the first side;
   a device disposed over the substrate and coplanar with the first surface, the device having a second side;
      wherein at least a first portion of the second side is disposed within approximately 3 mm from the first edge of the substrate; and
   a first barrier film that covers at least a portion of the first edge of the substrate, at least a portion of the first side of the substrate, and at least the first portion of the second side of the device.

2. The first product of claim 1, wherein at least the first portion of the second side of the device is disposed within approximately 2 mm from the first edge of the substrate.

3. The first product of claim 1, wherein at least the first portion of the second side of the device is disposed within approximately 1 mm from the first edge of the substrate.

4. The first product of claim 1, wherein at least the first portion of the second side of the device is disposed within approximately 0.5 mm from the first edge of the substrate.

5. The first product of claim 1, wherein at least the first portion of the second side of the device is disposed within approximately 0.1 mm from the first edge of the substrate.

6. The first product of claim 1,
   wherein the device comprises an active device area and an inactive device area; and
   wherein at least a portion of the active device area of the device is disposed within 0.1 mm from the first edge of the substrate.

7. The first product of claim 1, wherein the first barrier film comprises a mixture of polymeric material and non-polymeric material.

8. The first product of claim 7, wherein the first barrier film comprises a mixture of polymeric silicon and inorganic silicon.

9. The first product of claim 1, wherein the first barrier film is disposed over at least a portion of the device.

10. The first product of claim 1,
    wherein the device comprises a plurality of sides; and
    wherein the first barrier film covers each of the plurality of sides of the device.

11. The first product of claim 1,
    wherein the substrate has a first outer perimeter;
    wherein the device has a second outer perimeter; and
    wherein at least approximately 50% of the second outer perimeter of the device is disposed within approximately 1 mm from the first outer perimeter of the substrate.

12. The first product of claim 1, wherein the first barrier film is deposited using chemical vapor deposition CVD and an organosilicon precursor.

13. The first product of claim 1, wherein the first product comprises anyone of: a solar cell, a thin film battery, an organic electronic device, a lighting panel or a lighting source having a lighting panel, a display or an electronic device having a display, a mobile phone, a notebook computer, a tablet computer, a television, or an organic light emitting device (OLED).

14. The first product of claim 1,
wherein the first product further comprises an electronics packaging, and
wherein the electronics packaging has a total area that is less than the total area of the device.

15. The first product of claim 1, further comprising a plurality of devices, wherein each of the plurality of devices is disposed at a distance of less than 6 mm from at least one of the other devices.

16. The first product of claim 1,
wherein the substrate further comprises a second surface;
wherein a plurality of electrical conductors are disposed within the substrate; and
wherein each of the plurality of conductors extends from the first surface to the second surface of the substrate.

17. The first product of claim 1,
wherein a plurality of electrical conductors are disposed on the first side;
wherein the substrate further comprises a second surface; and
wherein each of the plurality of conductors extends from the first surface to the second surface of the substrate.

* * * * *